(12) United States Patent
Millar

(10) Patent No.: US 11,126,542 B2
(45) Date of Patent: Sep. 21, 2021

(54) SYSTEMS AND METHODS FOR PROGRAMMING A GROW POD

(71) Applicant: Grow Solutions Tech LLC, Lehi, UT (US)

(72) Inventor: Gary Bret Millar, Highland, UT (US)

(73) Assignee: Grow Solutions Tech LLC, Vineyard, UT (US)

( * ) Notice: Subject to any disclaimer, the term of this patent is extended or adjusted under 35 U.S.C. 154(b) by 474 days.

(21) Appl. No.: 15/972,726

(22) Filed: May 7, 2018

(65) Prior Publication Data

US 2018/0364987 A1  Dec. 20, 2018

Related U.S. Application Data

(60) Provisional application No. 62/519,330, filed on Jun. 14, 2017, provisional application No. 62/519,304, filed on Jun. 14, 2017.

(51) Int. Cl.
*A01G 9/24* (2006.01)
*A01G 7/00* (2006.01)
(Continued)

(52) U.S. Cl.
CPC .......... *G06F 11/3688* (2013.01); *A01G 7/00* (2013.01); *A01G 9/24* (2013.01); *A01G 31/042* (2013.01);
(Continued)

(58) Field of Classification Search
CPC ........... A01K 7/00; A01K 9/24; A01K 31/042
See application file for complete search history.

(56) References Cited

U.S. PATENT DOCUMENTS

| 4,992,942 A | 2/1991 | Bauerle et al. |
| 2003/0005626 A1 | 1/2003 | Yoneda et al. |

(Continued)

FOREIGN PATENT DOCUMENTS

| CN | 102893799 A | 1/2013 |
| CN | 105075731 A | 11/2015 |

(Continued)

OTHER PUBLICATIONS

"Grow Great Plants,Automatically."; URL: http://www.grobo.io/; 2017; Grobo.

(Continued)

*Primary Examiner* — Monica L Barlow
(74) *Attorney, Agent, or Firm* — Dinsmore & Shohl LLP

(57) ABSTRACT

Systems and methods for programming a grow pod are provided herein. One embodiment of a grow pod includes a plurality of carts for growing plants, a plurality of pod environment affecters, and a pod computing device that, when executed by a processor, causes the grow pod to receive a recipe program. The recipe program may define a grow recipe for the grow pod and may cause actuation of at least a portion of the plurality of pod environment affecters to facilitate growth for the plurality of respective plants. The recipe program may be created via a scripting language that includes a plurality of commands for controlling the grow pod. In some embodiments, the plurality of commands are specific to the grow pod. Embodiments of the grow pod may additionally instantiate a plurality of instances of the recipe program that correspond with each of the plurality of carts.

20 Claims, 18 Drawing Sheets

(51) Int. Cl.
    *G06F 11/36*     (2006.01)
    *A01G 31/04*     (2006.01)
    *G06F 30/20*     (2020.01)
    *G06F 8/30*     (2018.01)
    *A01G 9/20*     (2006.01)
    *A01G 9/18*     (2006.01)
    *G06Q 50/02*     (2012.01)
    *G06Q 10/08*     (2012.01)

(52) U.S. Cl.
    CPC ............ *G06F 8/31* (2013.01); *G06F 11/3684* (2013.01); *G06F 11/3692* (2013.01); *G06F 30/20* (2020.01); *A01G 9/18* (2013.01); *A01G 9/20* (2013.01); *G06Q 10/087* (2013.01); *G06Q 50/02* (2013.01)

(56) References Cited

U.S. PATENT DOCUMENTS

| | | | | |
|---|---|---|---|---|
| 2008/0276534 A1* | 11/2008 | Bissonnette | ......... | A01G 27/003 47/62 R |
| 2012/0054061 A1* | 3/2012 | Fok | ............ | A01G 13/0268 705/26.5 |
| 2013/0283683 A1 | 10/2013 | Ringbom et al. | | |
| 2014/0115958 A1* | 5/2014 | Helene | ............ | A01G 31/06 47/17 |
| 2015/0089866 A1 | 4/2015 | Abbott et al. | | |
| 2018/0007845 A1 | 1/2018 | Martin | | |

FOREIGN PATENT DOCUMENTS

| | | |
|---|---|---|
| CN | 205119369 U | 3/2016 |
| WO | 20160164652 A1 | 10/2016 |
| WO | 2017197129 A1 | 11/2017 |
| WO | 2017165935 A8 | 1/2018 |

OTHER PUBLICATIONS

"Leaf is a "Plug N' Plant" box to automatically grow pot in your home"; URL: https://techcrunch.com/2015/09/22/leaf-is-a-plug-n-plant-box-toautomatically-grow-pot-in-your-home/; 2015; TechCrunch Disrupt SF 2015.

"Remotely monitor and manage your grow room"; URL: https://www.growpodsolutions.com/grow-pod-solutions/growpodautomationsoftware/; 2016; Grow Pod Solutions.

International Search Report & Written Opinion dated Jul. 25, 2018, for International Application No. PCT/US2018/031513 filed on May 8, 2018.

* cited by examiner

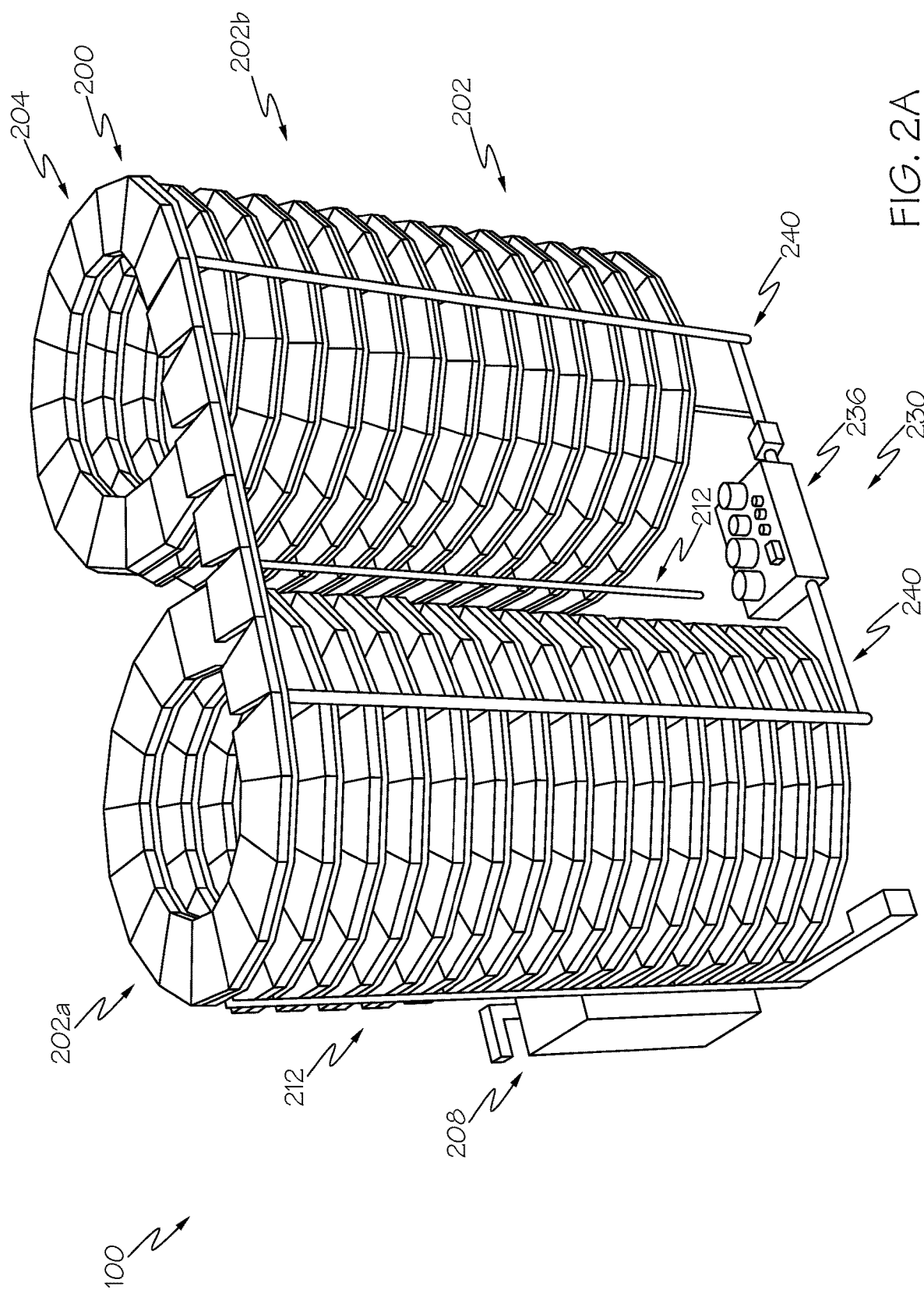

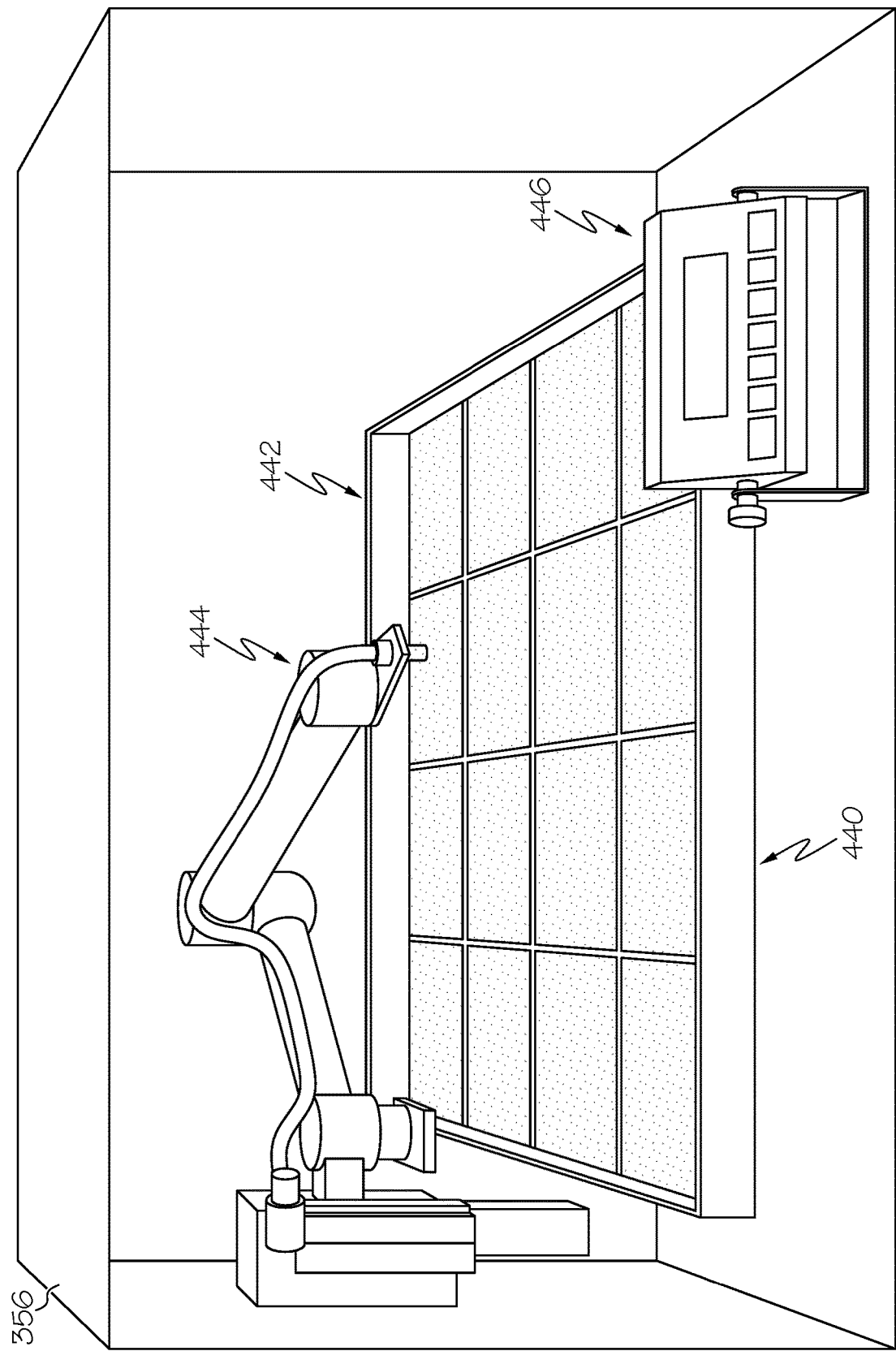

US 11,126,542 B2

SYSTEMS AND METHODS FOR PROGRAMMING A GROW POD

CROSS REFERENCE

This application claims the benefit of U.S. Provisional Application Ser. Nos. 62/519,330 and 62/519,304, both filed Jun. 14, 2017, which are hereby incorporated by reference in their entireties.

TECHNICAL FIELD

Embodiments described herein generally relate to systems and methods for programming a grow pod and, more specifically, to embodiments for providing a scripting language that may be utilized to create recipe programs for a grow pod.

BACKGROUND

While crop growth technologies have advanced over the years, there are still many problems in the farming and crop industry today. As an example, while technological advances have increased efficiency and production of various crops, many factors may affect a harvest, such as weather, disease, infestation, and the like. Additionally, while the United States currently has suitable farmland to adequately provide food for the U.S. population, other countries and future populations may not have enough farmland to provide the appropriate amount of food.

While greenhouses are widely used, they are typically static environments that maintain environment conditions for plants to grow. Greenhouses are an improvement over outdoor farming (for small volumes) in that the farmer can shield the plants from adverse weather conditions. While these greenhouses likely improve the output of the particular plants, currently, there is no automation or environment control. As such, current greenhouses typically provide little to no ability to control or improve the growth of a plant.

SUMMARY

Systems and methods for programming a grow pod are provided herein. One embodiment of a grow pod includes a plurality of carts for growing plants, a plurality of pod environment affecters, and a pod computing device that, when executed by a processor, causes the grow pod to receive a recipe program. The recipe program may define a grow recipe for the grow pod and may cause actuation of at least a portion of the plurality of pod environment affecters to facilitate growth for the plurality of respective plants. The recipe program may be created via a scripting language that includes a plurality of commands for controlling the grow pod. In some embodiments, the plurality of commands are specific to the grow pod. Embodiments of the grow pod may additionally instantiate a plurality of instances of the recipe program that correspond with each of the plurality of carts.

In another embodiment, a system includes a grow pod that includes a plurality of carts for growing plants and a programming computing device that includes a processor and a memory component that stores logic that, when executed by the processor, causes the system to provide a scripting language that includes a plurality of commands for controlling the grow pod and receive data related to the grow pod. In some embodiments, the logic causes the system to receive a command for the grow pod via the scripting language, utilize the command to create a recipe program that defines a grow recipe for the plants when utilized in the grow pod, and implement the recipe program on the grow pod, where implementing includes utilizing the grow pod to instantiate a plurality of instances of the recipe program that correspond with each of the plurality of carts.

In yet another embodiment, a programming computing device for programming a grow pod includes a processor and a memory component that stores programming logic that, when executed by the processor, causes the programming computing device to provide a scripting language that includes a plurality of commands for controlling the grow pod and receive data related to the grow pod. In some embodiments, the logic may cause the computing device to receive a command for the grow pod via the scripting language, utilize the command to create a recipe program that defines a grow recipe for plants utilized in the grow pod, and send the recipe program the grow pod for implementation. In some embodiments, implementation includes utilizing the grow pod to instantiate a plurality of instances of the recipe program that correspond with each of a plurality of carts that are utilized in the grow pod.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIGS. 2A-2E depict an operational structure for an assembly line grow pod, according to embodiments described herein;

FIGS. 4A-4C depict a testing chamber for physically simulating a program recipe for a cart in a grow pod, according to embodiments described herein;

DETAILED DESCRIPTION

Embodiments disclosed herein include systems and methods for programming a grow pod. Accordingly, embodiments described herein include logic specifically configured for implementing a scripting language for a grow pod according to a predetermined set of commands. These embodiments include programming a grow pod via a proprietary language with a recipe program that has been written for a specific grow pod or type of grow pod. The recipe program defines a grow recipe for the grow pod, where the grow recipe includes actuation of at least a portion of the plurality of pod environment affecters to facilitate growth for the plurality of respective plants. Once at least a portion of a recipe program is complete, embodiments may provide a simulator for simulating application of the recipe program for one cart or segment of a grow pod.

Additionally, embodiments may utilize a testing chamber (with a test compiler) that defines a closed environment and includes a plurality of environmental affecters, such as a heater, an air conditioner, a humidifier, a dehumidifier, a fan, an oxygen generator, a carbon dioxide generator, and/or other environmental affecter. The recipe program may be applied to one or more components of the testing chamber to physical simulate the recipe program. The testing chamber may be utilized to physically simulate a predetermined cart (or a subset carts) as it would be utilized in the particular assembly line grow pod. Once the recipe program meets predetermined metrics in the testing chamber, the recipe program may be downloaded to a physical grow pod and replicated into a plurality of instances, where each instance controls a single cart, tray, or segment of the grow pod (or plurality of carts, trays, or segments of the grow pod). The systems and methods for programming a grow pod incorporating the same will be described in more detail, below.

Figure 1:
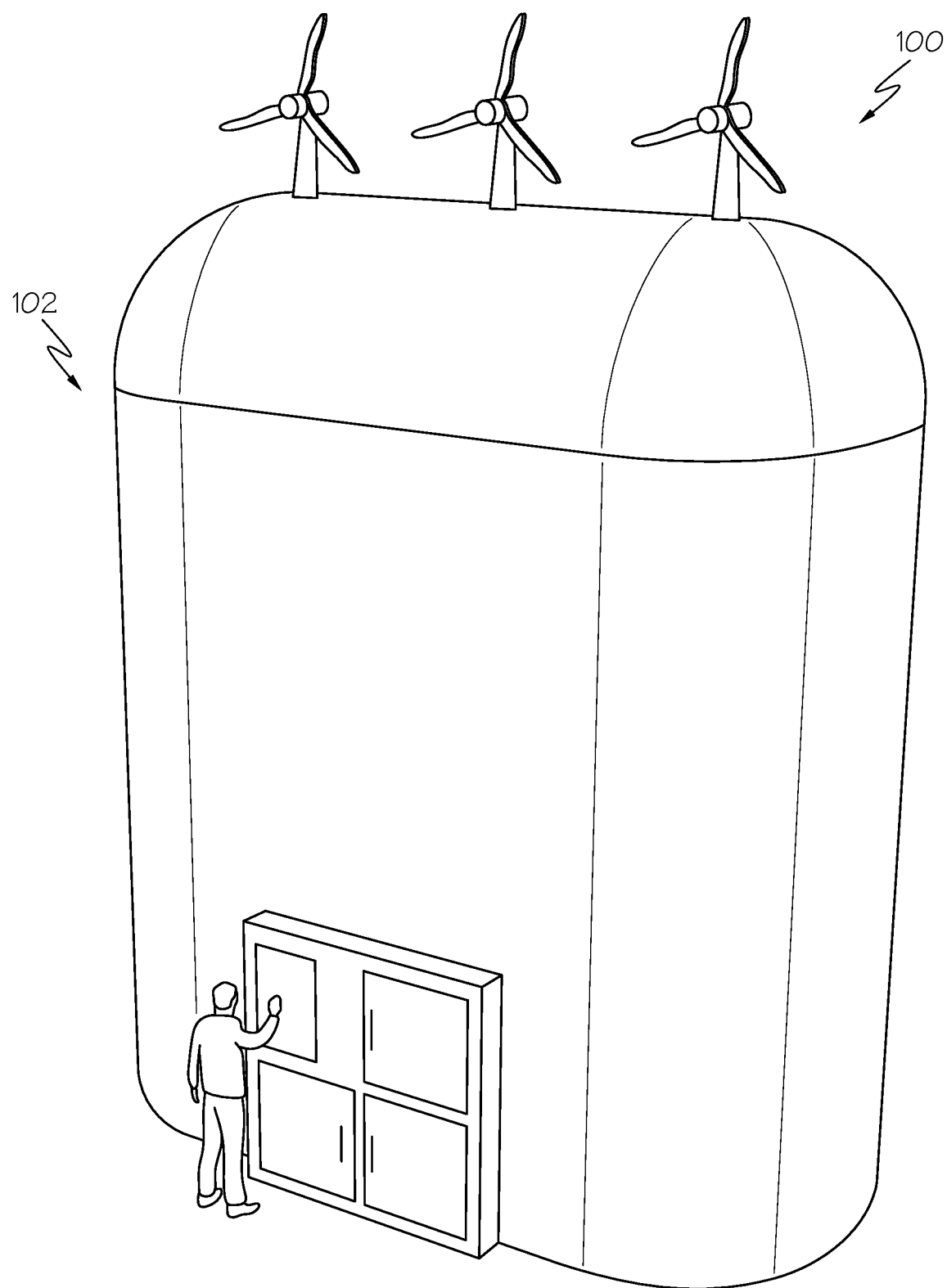
FIG. 1 depicts an assembly line grow pod according to embodiments described herein.

Referring now to the drawings, FIG. 1 depicts an assembly line grow pod 100 according to embodiments described herein. As illustrated, the assembly line grow pod 100 may be a self-contained unit that maintains an environment inside and prevents the external environment for entering (or at least affecting the interior portion). As such, the assembly line grow pod 100 may include an external shell 102 to provide this function. Coupled to the external shell 102 is a control panel 104 with a user input/output device 106, such as a touch screen, monitor, keyboard, mouse, etc.

Figure 2B:
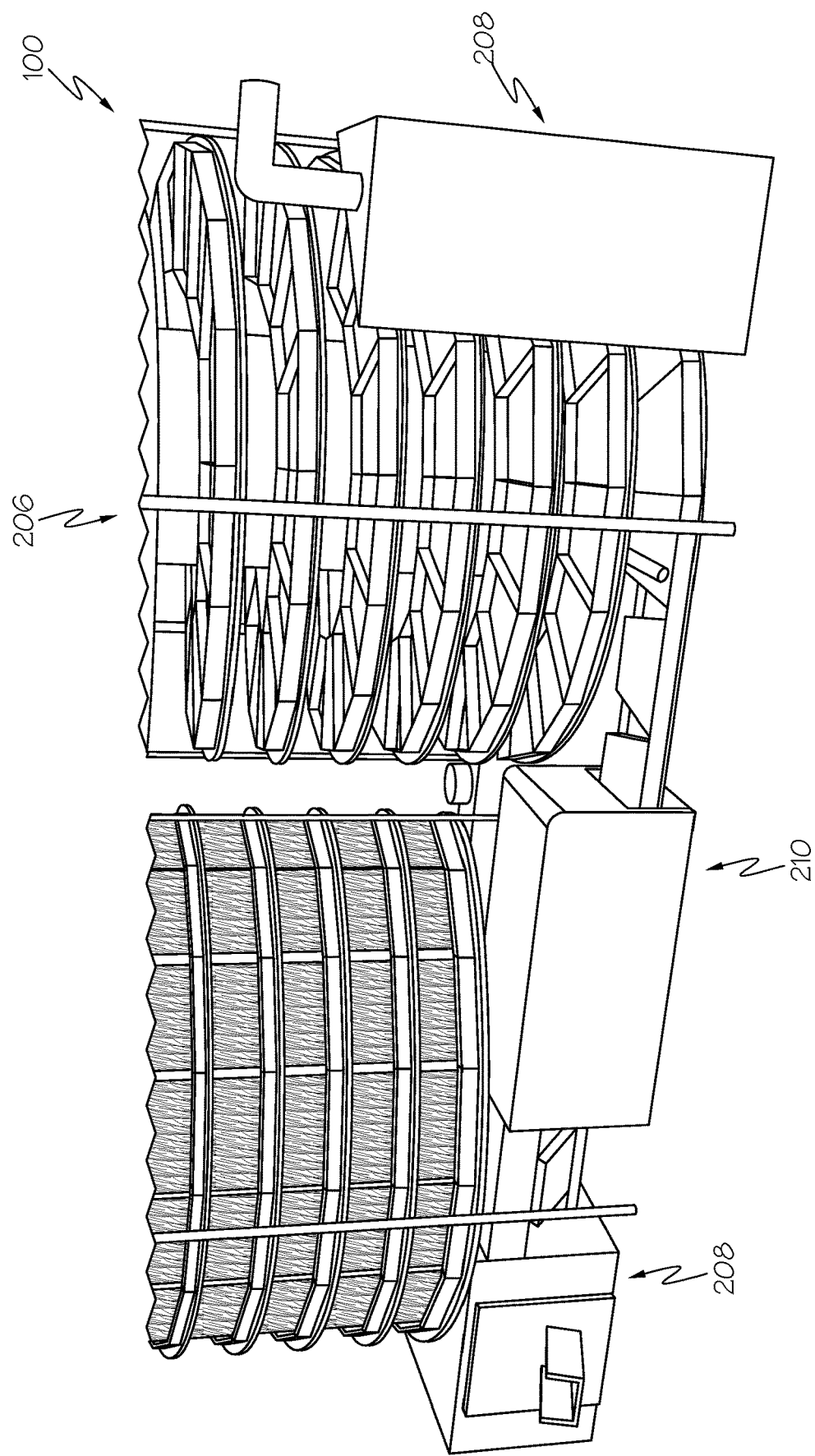

FIGS. 2A-2E depict an operational structure 200 for an assembly line grow pod 100, according to embodiments described herein. As illustrated in FIG. 2A, operational structure 200 may reside inside the external shell 102 and may include a track 202 that holds one or more carts 204. The track 202 may include an ascending portion 202a, a descending portion 202b, and a connection portion 202c. The track 202 may wrap around (in a counterclockwise direction in FIG. 2A, although clockwise or other configurations are also contemplated) a first axis such that the carts 204 ascend upward in a vertical direction. The connection portion 202c may be relatively level (although this is not a requirement) and is utilized to transfer carts 204 to the descending portion 202b. The descending portion 202b may be wrapped around a second axis (again in a counterclockwise direction in FIG. 2A) that is substantially parallel to the first axis, such that the carts 204 may be returned closer to ground level. Another connection portion may couple the lower portions of the ascending portion 202a and the descending portion 202b.

While not explicitly illustrated in FIG. 2A, the assembly line grow pod 100 may also include a plurality of pod environmental affecters, such as lighting devices, heaters, air conditioners, airflow devices, humidification devices, dehumidification devices, plant affecters (such as nutrient dosing components, water distribution components, seeder components, etc.), and/or other pod environmental affecters. As an example, lighting devices 206 (FIG. 2B), such as light emitting diodes (LEDs) may be included. The lighting devices 206 may be disposed on the track 202 opposite (e.g., above) the carts 204, such that the lighting devices 206 direct light waves to the carts 204 (and/or plants) on the portion the track 202 directly below. In some embodiments, the lighting devices 206 are configured to create a plurality of different colors and/or wavelengths of light, depending on the application, the type of plant being grown, and/or other factors. While in some embodiments, LEDs are utilized for this purpose, this is not a requirement. Any lighting device that produces low heat and provides the desired functionality may be utilized.

Also depicted in FIG. 2A is a master controller 236. The master controller 236 may include a pod computing device 230 and may include an input device, an output device and/or other components. The master controller 236 may be coupled to a nutrient dosing component, a water distribution component, a seeder component 208, and/or other hardware for controlling various components of the assembly line grow pod 100.

The seeder component 208 may be configured to seed one or more carts 204 as the carts 204 pass the seeder in the assembly line. Depending on the particular embodiment, each cart 204 may include a single section tray for receiving a plurality of seeds. Some embodiments may include a multiple section tray for receiving individual seeds in each section (or cell) or receiving a plurality of seeds in each cell. In the embodiments with a single section tray (or plurality of cells with a plurality of seeds in each cell), the seeder component 208 may detect presence of the respective cart 204 and may begin laying seed across an area of the cells. The seed may be laid out according to a desired depth of seed, a desired number of seeds, a desired surface area of seeds, and/or according to other criteria. In some embodiments, the seeds may be pre-treated with nutrients and/or anti-buoyancy agents (such as water) as these embodiments may not utilize soil to grow the seeds and thus might need to be submerged.

In the embodiments where a multiple section tray is utilized with one or more of the carts 204, the seeder component 208 may be configured to individually insert seeds into one or more of the sections of the tray. Again, the seeds may be distributed on the tray (or into individual cells) according to a desired number of seeds, a desired area the seeds should cover, a desired depth of seeds, etc.

The watering component may be coupled to one or more water lines 240, which distribute water and/or nutrients to one or more trays at predetermined areas of the assembly line grow pod 100. In some embodiments, seeds may be sprayed to reduce buoyancy and then watered. Additionally, water usage and consumption may be monitored, such that at subsequent watering stations, this data may be utilized to determine an amount of water to apply to a seed at that time.

Also depicted in FIG. 2A are airflow lines 212. Specifically, the master controller 236 may include and/or be coupled to one or more components that delivers airflow for temperature control, pressure, carbon dioxide control, oxygen control, nitrogen control, etc. Accordingly, the airflow lines 212 may distribute the airflow at predetermined areas in the assembly line grow pod 100.

FIG. 2B depicts a plurality of components for an assembly line grow pod 100, according to embodiments described herein. As illustrated, the seeder component 208 is illustrated, as well as a lighting device 206, a harvester component 238, and a sanitizer component 210. As described above, the seeder component 208 may be configured to seed the trays of the carts 204. The lighting devices 206 may provide light waves that may facilitate plant growth. Depending on the particular embodiment, the lighting devices 206 may be stationary and/or movable. As an example, some embodiments may alter the position of the lighting devices 206, based on the plant type, stage of development, recipe, and/or other factors.

Additionally, as the plants are lighted, watered, and provided nutrients, the carts 204 will traverse the track 202 of the assembly line grow pod 100. Additionally, the assembly line grow pod 100 may detect a growth and/or fruit output of a plant and may determine when harvesting is warranted. If harvesting is warranted prior to the cart 204 reaching the harvester, modifications to a recipe may be made for that particular cart 204 until the cart 204 reaches the harvester. Conversely, if a cart 204 reaches the harvester component 238 and it has been determined that the plants in that cart 204 are not ready for harvesting, the assembly line grow pod 100 may commission that cart 204 for another cycle. This additional cycle may include a different dosing of light, water, nutrients, and/or other treatment and the speed of the cart 204 could change, based on the development of the plants on the cart 204. If it is determined that the plants on a cart 204 are ready for harvesting, the harvester component 238 may facilitate that process.

In some embodiments, the harvester component 238 may simply cut the plants at a predetermined height for harvesting. In some embodiments, the tray may be overturned to remove the plants from the tray and into a processing container for chopping, mashing, juicing, etc. Because many embodiments of the assembly line grow pod 100 do not use soil, minimal (or no) washing of the plants may be necessary prior to processing.

Similarly, some embodiments may be configured to automatically separate fruit from the plant, such as via shaking, combing, etc. If the remaining plant material may be reused to grow additional fruit, the cart 204 may keep the remaining plant and return to the growing portion of the assembly line. If the plant material is not to be reused to grow additional fruit, it may be discarded or processed, as appropriate.

Once the cart 204 and tray are clear of plant material, the sanitizer component 210 may be implemented to remove any particulate, plant material, etc. that may remain on the cart 204. As such, the sanitizer component 210 may implement any of a plurality of different washing mechanisms, such as high pressure water, high temperature water, and/or other solutions for cleaning the cart 204 and/or tray. In some embodiments, the tray may be overturned to output the plant for processing and the tray may remain in this position. As such, the sanitizer component 210 may receive the tray in this position, which may wash the cart 204 and/or tray and return the tray back to the growing position. Once the cart 204 and/or tray are cleaned, the tray may again pass the seeder, which will determine that the tray requires seeding and will begin the process of seeding.

Figure 2C:
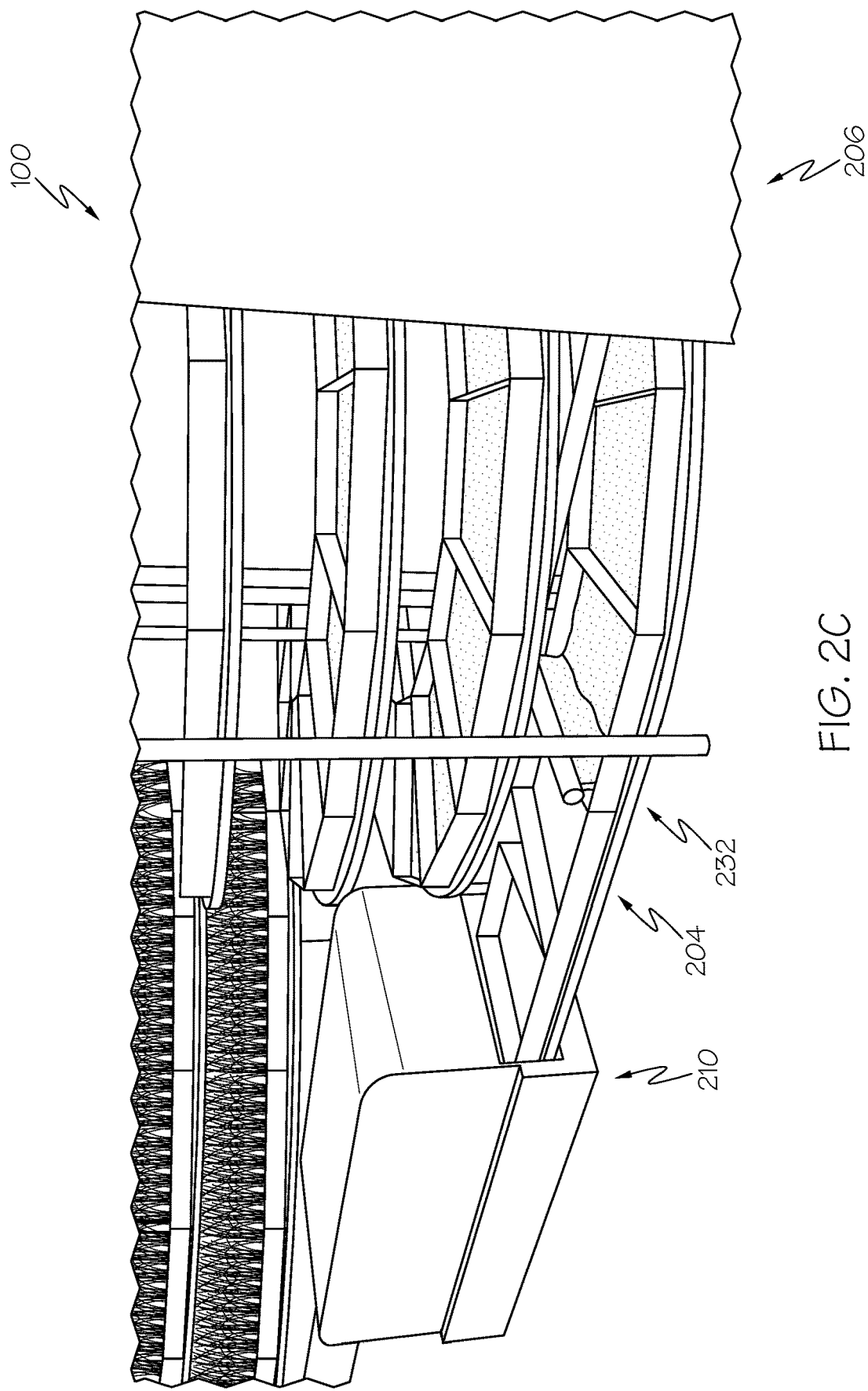

FIG. 2C depicts a seeder component 208 for an assembly line grow pod 100, according to embodiments described herein. As illustrated, the sanitizer component 210 may return the tray to the growing position, which is substantially parallel to ground. Additionally, a seeder head 242 may facilitate seeding of the tray as the cart 204 passes. It should be understood that while the seeder head 232 is depicted in FIG. 2B as an arm that spreads a layer of seed across a width of the tray, this is merely an example. Some embodiments may be configured with a seeder head 242 that is capable of placing individual seeds in a desired location. Such embodiments may be utilized in a multiple section tray with a plurality of cells, where one or more seeds may be individually placed in the cells.

Figure 2D:
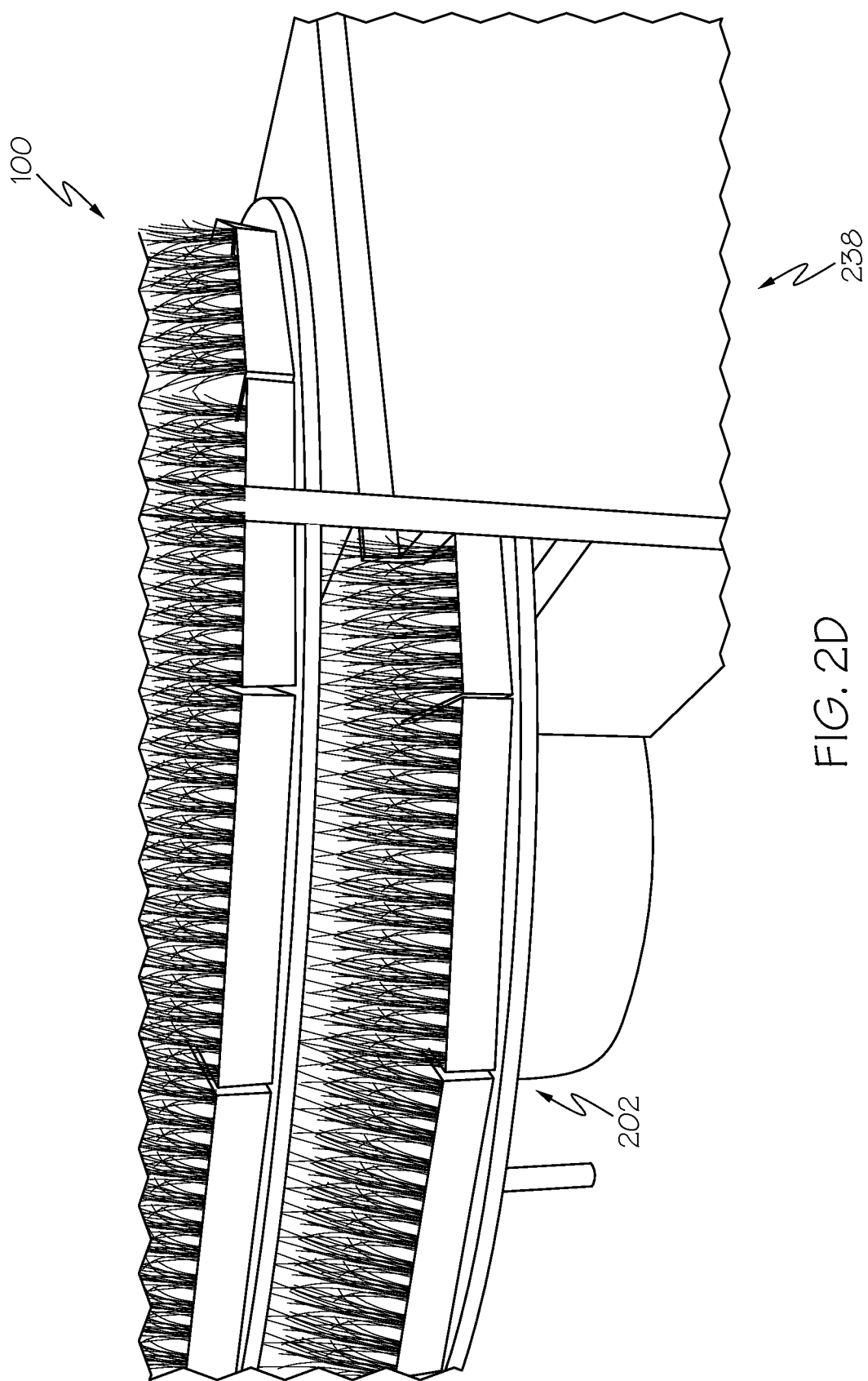

FIG. 2D depicts a harvester component 238 for an assembly line grow pod 100 according to embodiments described herein. As illustrated, the carts 204 may traverse the track 202 to facilitate growth of the plants. Depending on the particular embodiment, the carts 204 may be individually powered and/or powered collectively. As an example, some embodiments are configured such that each cart 204 includes a motor, which is powered by a connection to the track 202. In these embodiments, the track 202 is electrified to provide power and/or communications to the cart 204. If a cart 204 becomes incapacitated, communication may be sent to other carts 204 to push the incapacitated cart 204. Similarly, some embodiments may include a cart 204 that is battery powered, such that a battery charging component may be included in the assembly line grow pod 100. The battery may be used as primary power and/or backup power.

Regardless, the carts 204 may traverse the track 202 to the harvester component 238 for cutting, chopping, dumping, juicing, and/or otherwise processing. Depending on the embodiment, the final product may include a powder form of the plant, a chopped form of the plant, and/or other form of the plant.

Figure 2E:
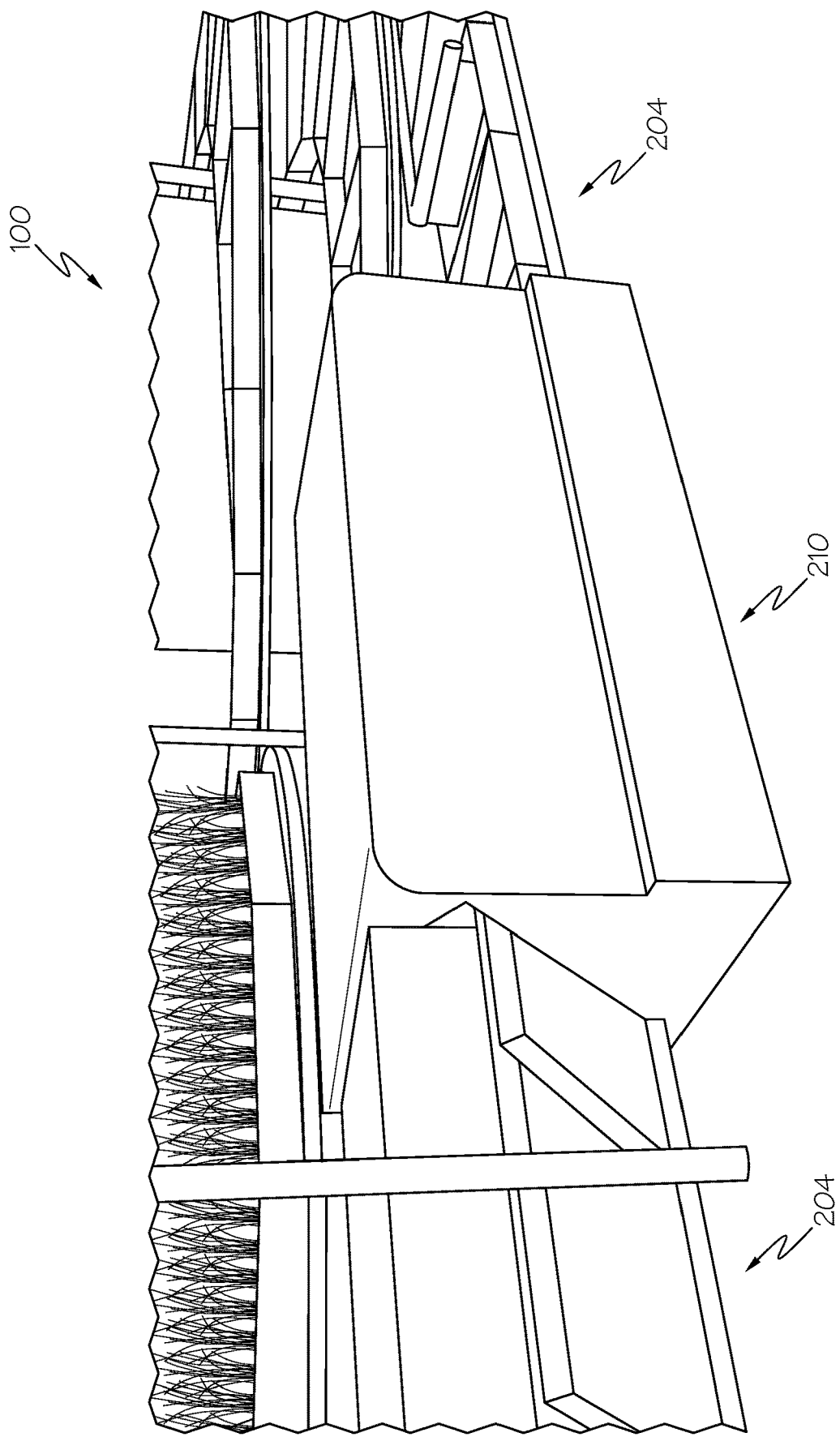

FIG. 2E depicts a sanitizer component 210 of an assembly line grow pod 100, according to embodiments described herein. As illustrated, the sanitizer component 210 may receive a cart 204 where the tray has been overturned and/or may overturn the tray itself. Regardless, the sanitizer component 210 may clean the cart 204 and/or tray and return the tray to the grow position.

It should be understood that while the tray may be overturned, this is merely an example. Specifically, some embodiments may desire to keep the cart 204 in contact with the track 202 to provide power, communication, and/or otherwise propel the cart 204 through the sanitizer component 210. As such, overturning only the tray (and not the entire cart 204) may be desired in these embodiments. In some embodiments however, the sanitizer component 210 may operate without overturning the tray. Similarly, some embodiments may be configured such that both the tray and cart 204 are overturned to facilitating cleaning.

It should also be understood that while the tray may be overturned, this simply implies that the tray is rotated such that a top surface is angled from level. This may include rotating the tray 180 degrees or rotating the tray only a few degrees, depending on the embodiment.

Figure 3:
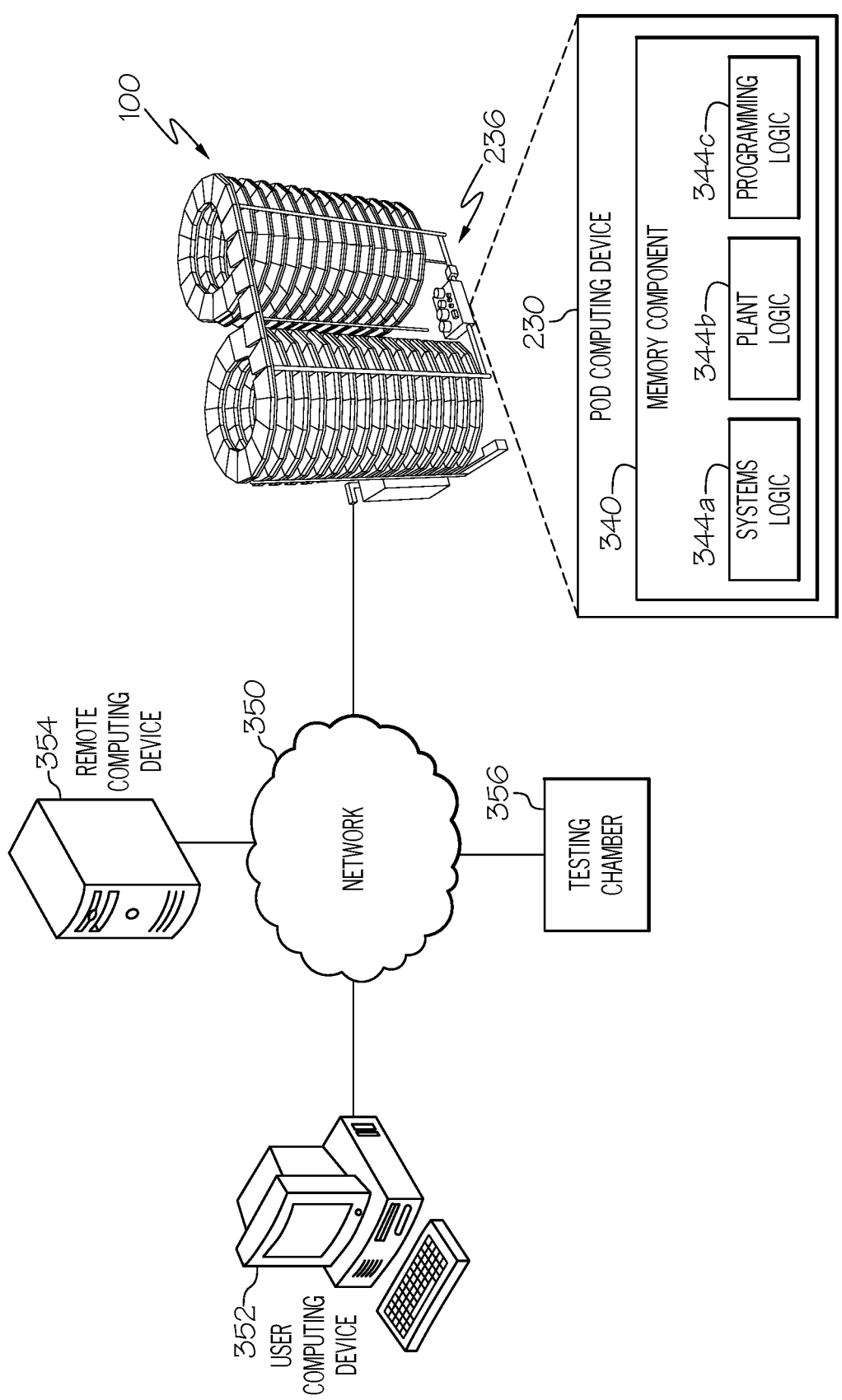
FIG. 3 depicts a computing environment for an assembly line grow pod, according to embodiments described herein.

FIG. 3 depicts a computing environment for an assembly line grow pod 100, according to embodiments described herein. As illustrated in FIG. 2A, the assembly line grow pod 100 may include the master controller 236, which may include the pod computing device 230. The pod computing device 230 may include a memory component 340, which stores systems logic 344a, plant logic 344b, and programming logic 344c. The systems logic 344a may monitor and control operations of one or more of the components of the assembly line grow pod 100. The plant logic 344b may be configured to determine and/or receive a recipe for plant growth and may facilitate implementation of the recipe via the systems logic 344a. The programming logic 344c may be configured to provide a simulator program, a testing chamber program, one or more of the user interfaces, compilers, simulators, etc. for creating a recipe program and/or otherwise implementing a scripting language that is specifically directed to operating the assembly line grow pod 100.

Additionally, the assembly line grow pod 100 is coupled to a network 350. The network 350 may include the internet or other wide area network, a local network, such as a local area network, a near field network, such as Bluetooth or a near field communication (NFC) network. The network 350 is also coupled to a user computing device 352 and/or a remote computing device 354. The user computing device 352 may include a personal computer, laptop, mobile device, tablet, server, etc. and may be utilized as an interface with a user. As an example, a user may create and send a recipe program to the pod computing device 230 for implementation by the assembly line grow pod 100. Another example may include the assembly line grow pod 100 sending notifications to a user of the user computing device 352.

Similarly, the remote computing device 354 may include a server, personal computer, tablet, mobile device, etc. and may be utilized for machine to machine communications. As an example, if the assembly line grow pod 100 determines a type of seed being used (and/or other information, such as ambient conditions), the pod computing device 230 may communicate with the remote computing device 354 to retrieve a previously stored recipe (or recipe alteration) for those conditions. As such, some embodiments may utilize an application program interface (API) to facilitate this or other computer-to-computer communications.

The testing chamber 356 may also be coupled to the network 350 and may be utilized for testing a recipe program. As an example, a user may create a recipe program via the user computing device 352, and/or via the pod computing device 230 (collectively referred to herein as the "programming computing device"). As such, the programming computing device may include a word processing program and/or other logic (such as a program with specific grow pod programming tools) to create the recipe program, which may include a programmed description of the assembly line grow pod 100 and/or one or more actions for the assembly line grow pod 100 to take. The program recipe may be simulated by the user computing device 352, the pod computing device 230, the remote computing device 354, and/or other computing device to determine operation and errors with the created recipe program. Based on the results of the simulation, the recipe program may be edited and/or sent for execution by the testing chamber 356.

As discussed in more detail below, the testing chamber 356 may include one or more environmental affecters to physically simulate a single cart as used in the assembly line grow pod 100. If the recipe program meets desired functionality from the testing chamber 356, the recipe program may be sent to the pod computing device 230 for implementation. Implementation of the recipe program may include creating a single instance of the recipe for each cart being utilized by the assembly line grow pod 100.

As will be understood, while the pod computing device 230 depicted in FIG. 3 includes the systems logic 344a, the plant logic 344b, and the programming logic 344c, the other computing devices of FIG. 3 may include the same and/or similar logic for creating, simulating, and/or implementing the recipe program as described herein.

The grow pod programming language may include a plurality of commands that may be part of a scripting language specifically for grow pods and/or the assembly line grow pod 100. The commands may be part of a library and the scripting language may include a plurality of libraries, depending on the embodiment. The scripting language may include commands for actuating one or more lighting devices 206 of the grow pod, temperature components, humidity components, air flow components of the grow pod, and/or other pod environment affecters.

Depending on the embodiment, the grow pod programming language may utilize a plurality of keywords (e.g., air, alert, break, call, cycles, doser, else, exit, func, halt, if, light, message, off, on, start_time, recipe, timer, water, etc.), tokens (e.g., "." (hardware), "#" (comments), "%" (variable), "{ }" (inclusive), "[ ]" (arrays), "( )" (compares), etc.), hardware ports (.red (wand red LED), .blue (wand blue LED), .warm (wand warm white LED), .cool (wand cool white LED), .uv (wand ultra violet LED), light_pos (wand position from plant), .tempareature_max (temperature maximum), .temperature_min (temperature minimum), .humidity_max (humidity maximum), .humidity_min (humidity minimum), .airflow_max (airflow maximum), .airflow_min (airflow minimum), .co2 (amount of carbon dioxide in environment, .comm_error (transmission error flag), .water_level (amount of water in tank), .ph (pH of water), .ec (water electrical conductivity reading), .moisture (moisture level), etc.), arithmetic operators (e.g., "+" (addition), "−" (subtraction), "*" (multiplication), "/" (division), "^" (exponential), etc.), logical operators (e.g., "&" (logical AND), "|" (logical OR), "!" (logical NOT), "=" (equal), "!=" (not equal), "<" (less than), ">" (greater than), etc.) and/or other commands.

Additional commands of the grow pod programming language may also be provided, such as those depicted in Table A, below

TABLE A

Commands

| COMMAND | FUNCTION |
|---|---|
| AIR | allows the environmental variables to be changed |
| ALERT | cause the program to send a message to a prearranged Email or TXT message specified by the EMAIL tag in the INI file. This command will not stop or halt the program. |
| BREAK | stops the looping cycle and exits; the next command following the Cycle { } is then executed. |
| CALL | executes a function or subfunction located somewhere else in the program. Once the function has completed its task the program will return to the location from where the CALL originated. |
| CYCLES | performs a set number of loops, where all commands placed between the { } are executed X number of times. X can be a value of 0 = 65535. |
| DOSER | used to add nutrients specified by X into the tank specified by the WATER command in the amount specified by Y. |
| ELSE | used with an IF command. When the IF is not performed the ELSE is executed. |
| EXIT | stops the execution at any location and exits the program. This command should be used with caution. If the command for watering is left ON the grow chamber can flood. |

TABLE A-continued

Commands

| COMMAND | FUNCTION |
|---|---|
| FUNC | identifies the start location of a subprogram. Once the FUNC is completed, execution will continue from where the CALL command was made. |
| HALT | stops the program and waits for a key to be pressed. The X value can be left blank which then defaults to 'any key pressed' will start the program again. If a specific key is desired then use HALT = A; the letter A must be pressed to resume execution. An IF command allows the program to check the state of a Variable or Hardware port and to execute a specific set of instructions based on the results. |
| LIGHT = X | used to write to the grow lights. If X is specified then only that Light wand will be written. If the X is left blank all light wands will be written. A Message command allows for information to be written the screen and to the LOG file. |
| OFF | used to turn off a selected device. When used with the WATER command, watering is turned off. The X value is the number of seconds the device will be turned off. If X is omitted or set to zero, the TIMER command can be used to control the amount of seconds the device is off. |
| ON | used to turn on a selected device. When used with the WATER command, watering is turned on. The X value is the number of seconds the device will be turned on. If X is omitted or set to zero, the TIMER command can be used to control the amount of seconds the device is on. |
| START_TIME | used to control the system clock. The X valve represent the system's start time. If the START_TIME is set to 9:00 and the program is started at 10:00 the program adjusts the execution point to one hour into the programmed step and begin executing. |
| TIMER | used to allow the LIGHT and WATER commands to have timed delays. |
| WATER | used to control the watering. The X valve represent the tank the watering is to draw from to perform the watering. |

Additionally, once the recipe program is written, execution of the recipe program may include communicating commands via a packet transfer protocol. As an example, the following packet formats may be utilized, as provided in Tables B-E, below.

TABLE B

System Write Packet

| Start Token | 245 |
|---|---|
| Command Type | 0-20 |
| Physical Address | 1-225 |
| Seq Address | 1-225 |
| Act Address | 1-225 |
| Separator Token | 247 |

TABLE C

System Read Packet

| Start Token | 245 |
|---|---|
| Command Type | 21-30 |
| Physical Address | 1-225 |
| Seq Address | 225 |
| Act Address | (1-225) |
| Separator Token | 247 |

TABLE D

Device Write Packet

| Start Token | 245 |
|---|---|
| Device Type | 31-110 |
| Command Type | 1-255 |
| Seq Address | 1-225 |
| Act Address | 1-225 |
| Separator Token | 247 |
| Action | 0-225 |
| End Token | 250 |

TABLE E

Device Read Packet

| Start Token | 245 |
|---|---|
| Command Type | 131-210 |
| Physical Address | 1-225 |
| Seq Address | 225 |
| Act Address | 1-225 |
| Separator Token | 247 |
| Response | 0-225 |
| End Token | 250 |

For example, a packet for a valve write command may include one of the following:

245, 33, 0, 1, 1, 247, 110, 250<-Turn On Valve and Send Status 245, 33, 0, 1, 1, 247, 120, 250<-Turn Off Valve and Send Status 245, 33, 0, 1, 1, 247, 204, 250<-Do Nothing Sent Status An example packet for a valve read command may include the following:

245, 133, (PHS ADDR), (SEQ ADDR),(ACT ADDR), 247, 110:1023

In operation, these commands and packets may be utilized in the scripting language to provide a construct through a plurality of commands to activate and/or deactivate one or more components of a grow pod for growing a predetermined plant. This may include the planting/depositing of seeds in the grow pod; watering, lighting, providing nutrients to the seeds in the grow pod; harvesting the plants that grow in the grow pod; and/or implementing other functions, such as cart speed, contaminant, control, etc. as applicable to the specific grow pod.

Accordingly, the recipe program may be created using the user computing device 352 (FIG. 3) and/or other computing device, which may or may not have the exact specifications of the actual grow pod on which the program will be implemented. As such, embodiments of the user computing device 352 and/or embodiments of the pod computing device 230 may be configured to compile the recipe program and determine if the recipe program is compatible with the particular grow pod, such as assembly line grow pod 100 (or other grow pod on which the recipe program will be implemented). While the pod computing device 230 may be configured to determine this directly, the user computing device 352 may communicate with the pod computing device 230 and/or may receive user input regarding the components of the actual grow pod to make this determination.

Additionally, the user computing device 352 may be configured to provide a simulator for simulating operation of the program on a virtual grow pod. The user computing device 352 may also be configured for uploading the program to the actual grow pod (such as the assembly line grow pod 100).

Figure 4A:
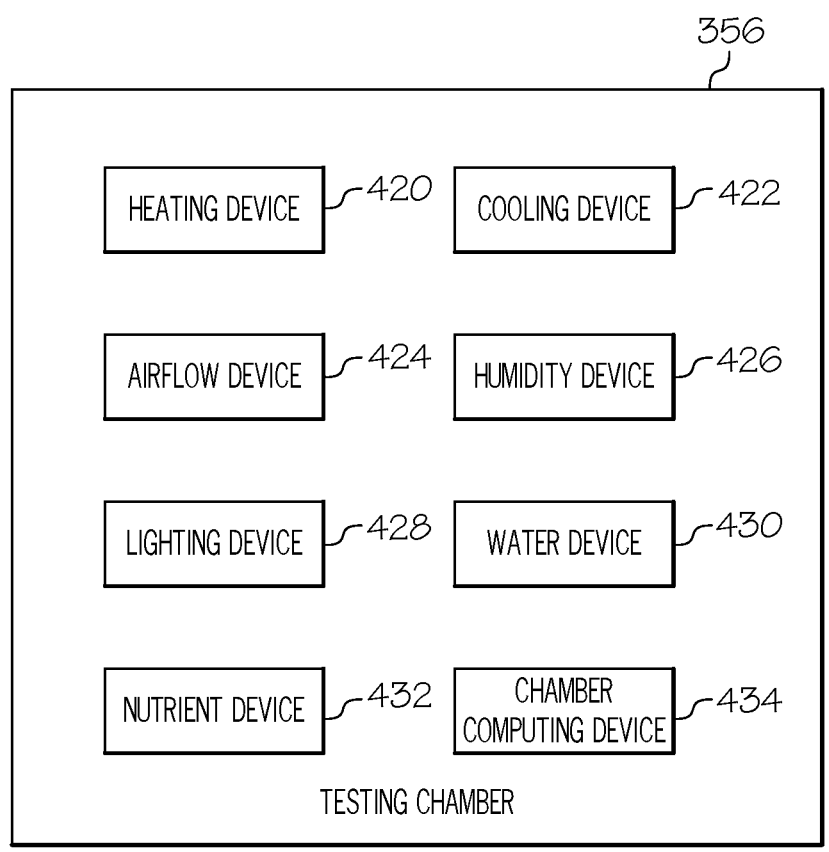
Figure 4C:
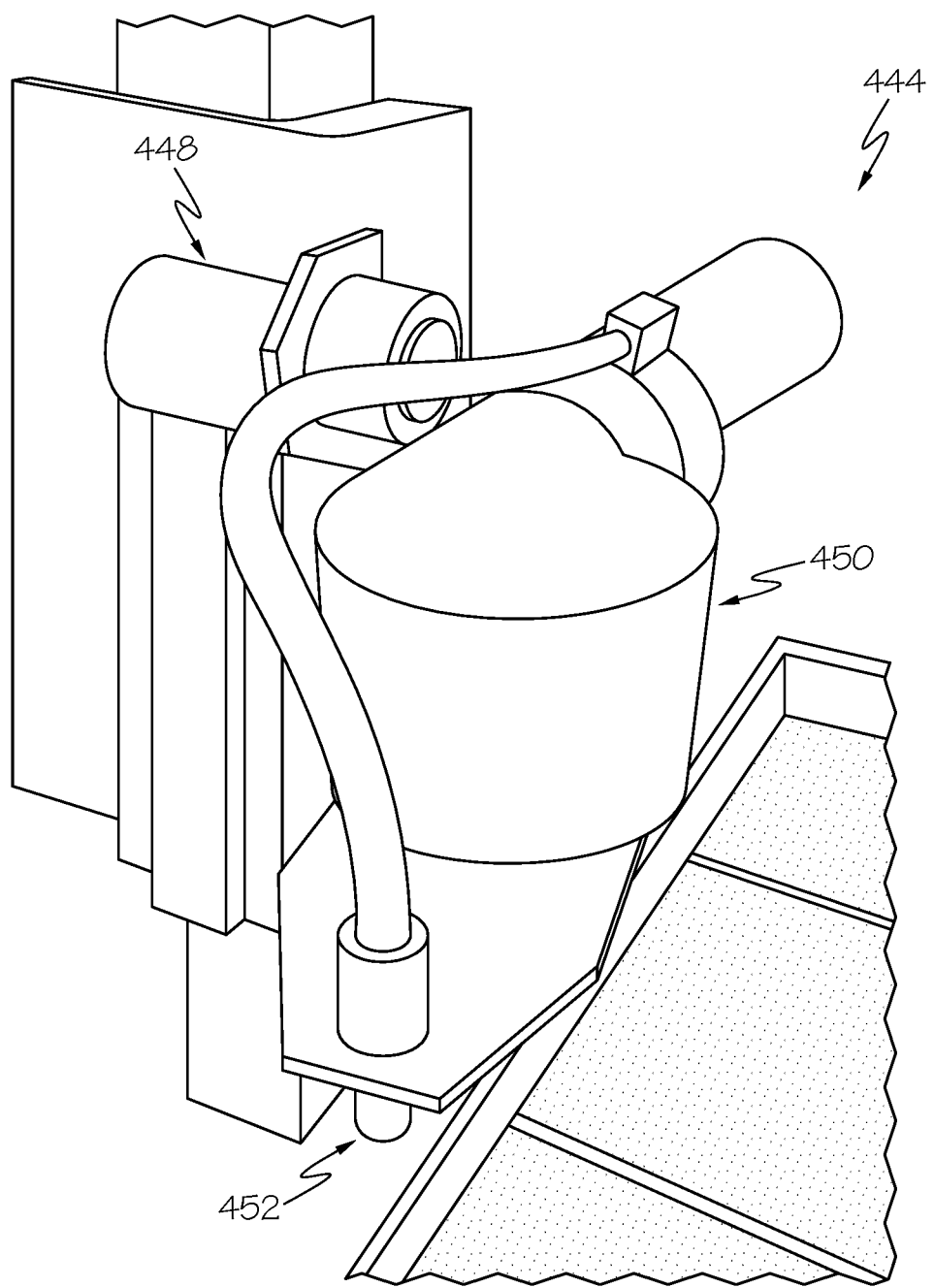

FIGS. 4A-4C depict a testing chamber 356 for physically simulating a program recipe for a cart in a grow pod, according to embodiments described herein. As illustrated in FIG. 4A, the testing chamber 356, may include a plurality of chamber environment affecters, such as a heating device 420, a cooling device 422, an airflow device 424, a humidity device 426, a lighting device 428, a water device 430, a nutrient device 432, and/or other chamber environment affecters, such as a cart, a tray, a portion of a track, a wheel turning device, and/or other components for simulating the cart traversing the track, receiving seed, water, nutrients, etc. and/or harvesting. Also included is a chamber computing device 434 with and/or coupled to the testing chamber 356.

Depending on the embodiment, the chamber environment affecters may substantially match the pod environment affecters for a particular grow pod or type of grow pod. However, some embodiments may be configured where the chamber environment affecters include any and all possible pod environment affecters or more than would be in any one grow pod (so as to be able for use with a plurality of different grow pods). Regardless, the chamber environment affecters may be configured to simulate the cart traversing a track in a particular grow pod, as well as the environmental conditions in the particular grow pod. As the testing chamber 356 may be configured without a full track, the chamber computing device 434 may be configured to not only recognize the recipe program, but also determine modifications to the recipe program to make the recipe program properly operate in the testing chamber 356.

As an example, the chamber computing device 434 may determine a location of lights in the particular grow pod, a total distance the cart travels, inclines, declines, turns on the track, a location of the pod environment affecters and determine timing and output of the chamber environment affecters to properly physically simulate the recipe program in the testing chamber 356. As such, the cart holding apparatus and/or one or more of the chamber environment affecters may be configured to move in order to make the simulation more accurate. As an example, if the testing chamber 356 includes a chamber cart, the testing chamber 356 may be include motors and/or other components configured to tilt, shake, vibrate, etc. the chamber cart 440, as well as move the heating device 420 from a front portion to a back portion of the cart to simulate the cart traversing a particular section of the grow pod.

FIG. 4B depicts a perspective view of a testing chamber 356, according to embodiments described herein. As illustrated, this embodiment of the testing chamber 356 receives a chamber cart 440 440, which includes a plurality of cells. Depending on the particular embodiment, the chamber cart 440 may reside on a cat holding apparatus that includes one or more mechanisms for altering the orientation and/or position of the chamber cart 440 relative to ground and/or environmental affecters.

Also included is a robot arm 444 for distributing seeds 442, water, nutrients, and/or other materials. The seeds 442 may be distributed in a relatively uniform layer across one or more of the cells. The robot arm 444 may also follow the recipe for distributing water, nutrients, and/or other materials to the seeds 442. Also provided is a display 446 that is connected to the chamber computing device 434 for providing data associated with the environment, the seeds, the recipe, and/or other data.

It should be understood that while the embodiment of FIG. 4B illustrates the testing chamber 356 such that internal components may be viewed from outside the testing chamber 356, this is must an example. Some embodiments may include an opaque outer shell that prevents light from penetrating to reduce and/or eliminate light pollution and fully control the lighting environment inside.

FIG. 4C depicts a perspective view of the robot arm 444, according to embodiments described herein. As illustrated, the robot arm 444 includes a pump 448, a motor 450, and a fluid output device 452 for distributing water, nutrients, and/or other materials to the seeds 442. In operation, the motor 450 may be coupled to the chamber computing device 434, which may provide commands for watering and nutrient distribution to one or more of the cells according to the recipe program. The pump 448 may cause the fluid to be physically communicated from a reservoir to the seeds 442 via the fluid output device 452.

It should be understood that some embodiments may also work to improve the recipe program. As such, embodiments may be configured to monitor output of the plant, compare output of the plant against a predetermined output, and determine recipe improvements to improve output of future plants.

Figure 5:
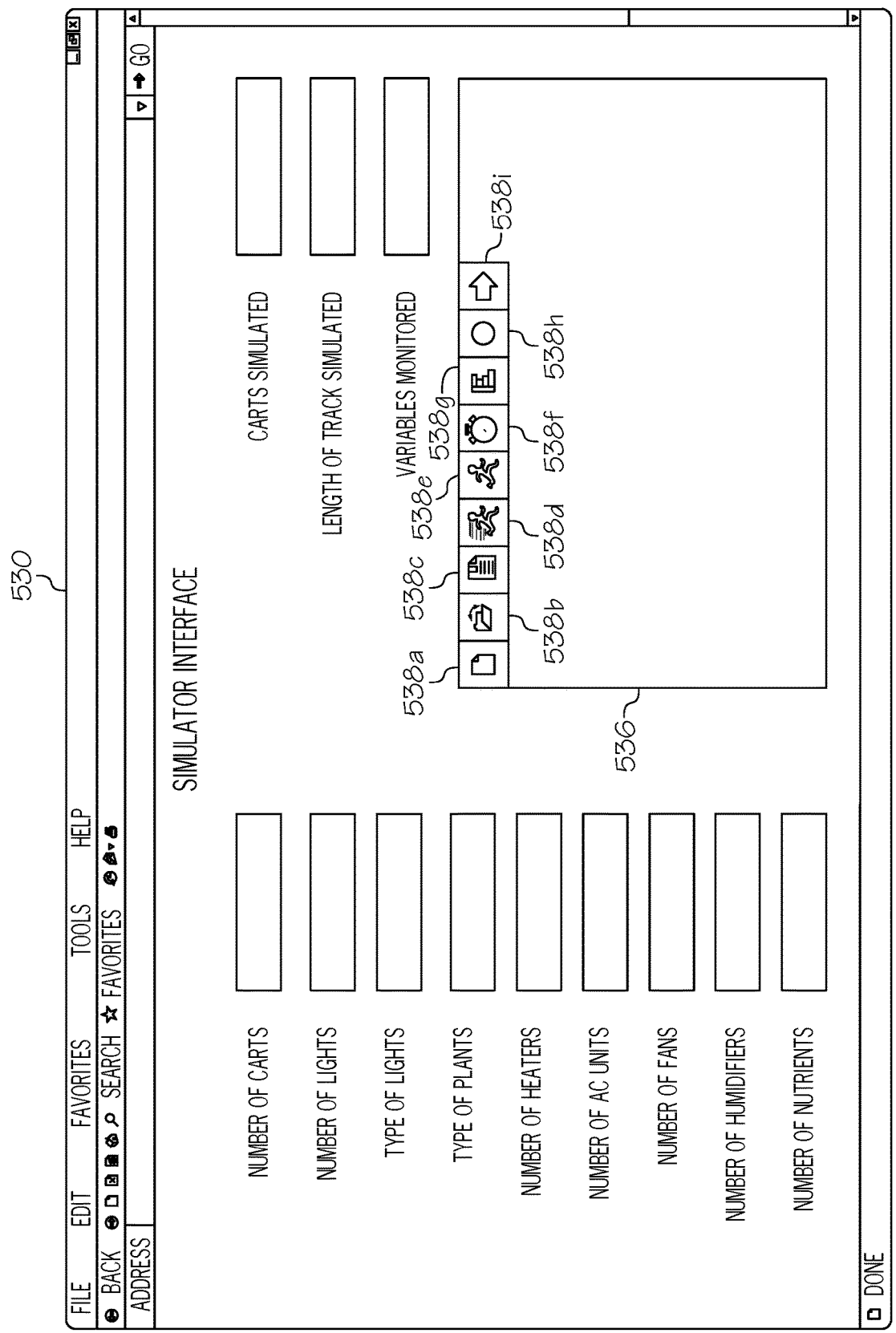
FIG. 5 depicts a simulator interface for electronically simulating a recipe program, according to embodiments described herein.

FIG. 5 depicts a simulator interface 530 for electronically simulating a recipe program, according to embodiments described herein. As illustrated, the simulator interface 530 may include a plurality of fields for entering characteristics and/or feature of a particular grow pod. As an example, user options may include at least one user option for selecting a number of carts, a number of lights, a type of lights, a type of plants, a number of heaters, a number of air conditioning units, a number of airflow units, a number of humidifiers, a number of nutrient providers, a number of carts that are being simulated (e.g., number of instances of the recipe program that are instantiated), a length of track simulated, a variables monitored, and/or other features. While in some embodiments the user may enter and/or edit the grow pod data, some embodiments may be configured such that the master controller 236 is configured to create a file that is received by the programming computing device for automatically populating the grow pod data into the simulator.

Also provided in the simulator interface 530 is a programming window 536. The programming window 536 may be configured to receive and/or provide text of a recipe program. As such, the programming window 536 may include a new option 538a for creating a new file for a recipe program. An open option 538b may be provided for opening a stored recipe program. An edit option 538c may be provided for editing an existing recipe program. An execute option 538d may be provided to execute a loaded recipe program. A simulate option 538e may be provided to simulate a loaded recipe program. A clock option 538f may be provided to reset a clock. A log option 538g may be provided to view a log file of a previously executed or simulated recipe program. A halt option 538h may be provided to halt execution of simulation of a recipe program. A resume option 538i may be provided to resume execution or simulation of a recipe program.

As such, the simulator interface 530 may be configured to facilitate receiving a recipe program and grow pod data to simulate operation of the recipe program. Based on the results of the simulation, the user may edit portions of the recipe program and/or the grow pod data.

Figure 6:
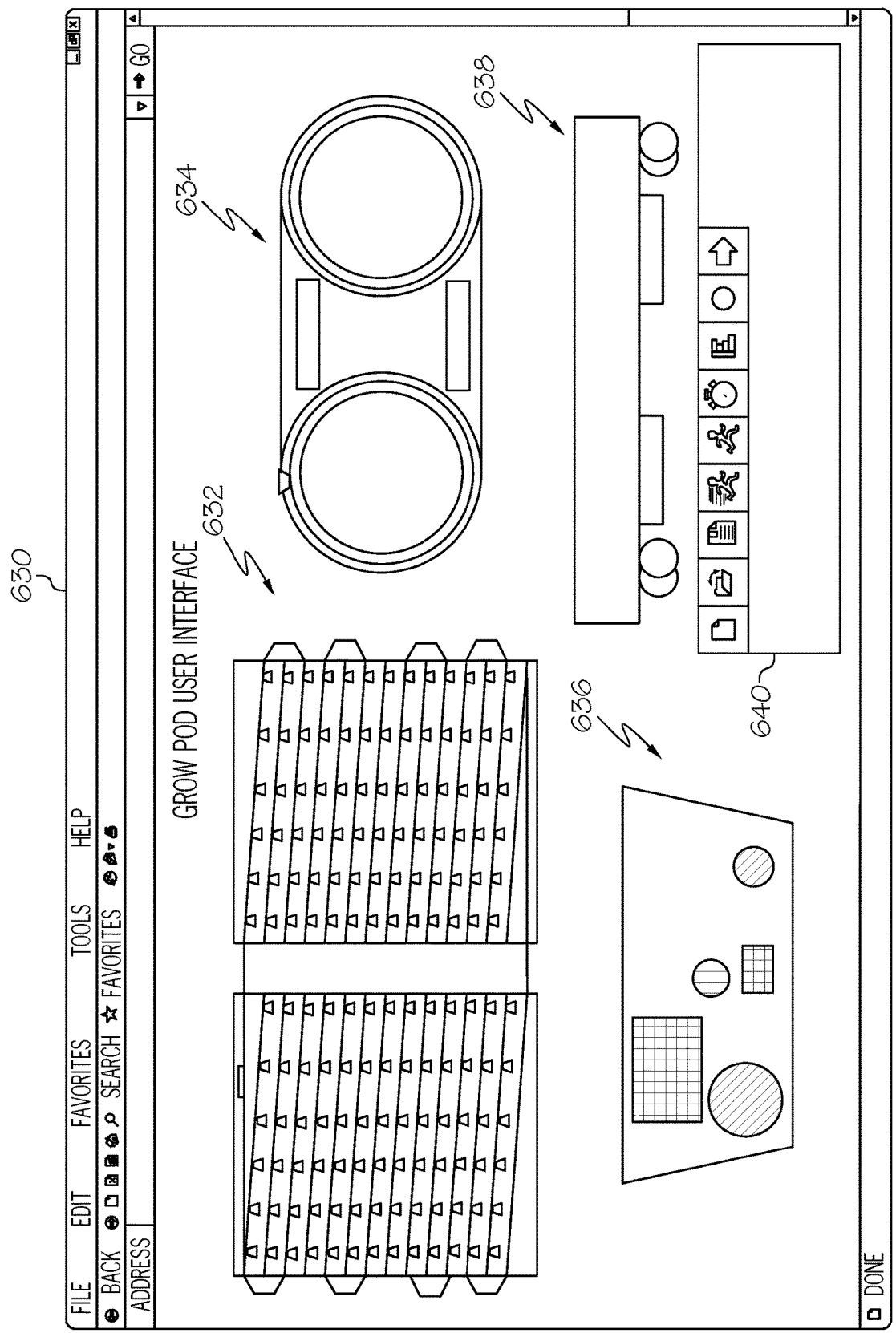
FIG. 6 depicts a simulator interface for providing results of a recipe program, according to embodiments described herein.

FIG. 6 depicts a simulator interface 630 for providing results of a recipe program, according to embodiments described herein. In response to running a simulation of the recipe program, the simulator interface 630 may be provided. As illustrated, the simulator interface 630 may include a grow pod side image 632, which may be a static and/or animated pictorial representation of the simulated grow pod. A grow pod top image 634 is also provided, as well as a cart top image 636, and a cart side image 638. A program window 640 is also provided.

When the recipe program is simulated, the simulator interface 630 may provide an animated simulation of the grow pod (from the grow pod data and recipe program). If errors or other undesirable events occur, the simulator may identify the undesirable event and the animation may be changed to indicate the events. Undesirable events may include actual errors with the grow pod, cart, or seeds, as well as growth not meeting desired metrics. In some embodiments, the recipe program may also be animated to illustrate the portion of code being simulated and/or identifying a portion of the code causing the undesirable event. The user may edit the recipe program in the program window 640, accordingly.

Figure 7:
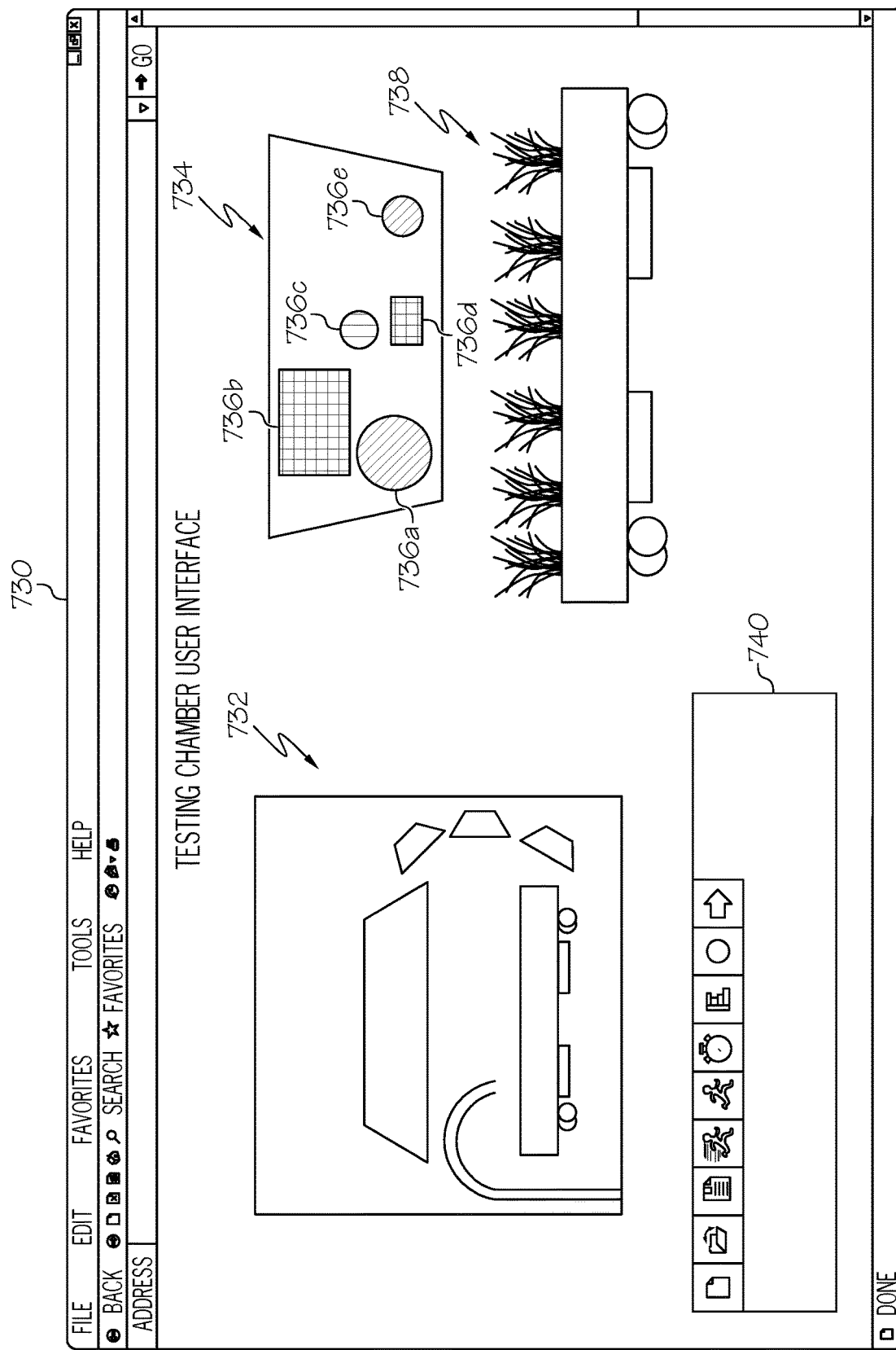
FIG. 7 depicts a testing chamber interface for providing information associated with a physical simulation of a recipe program on a cart in a testing chamber, according to embodiments described herein.

FIG. 7 depicts a testing chamber interface 730 for providing information associated with a physical simulation of a recipe program on a cart in a testing chamber 356, according to embodiments described herein. As discussed above, some embodiments may be configured to first simulate the recipe program and then physically simulate using the testing chamber 356. Regardless of whether this workflow is utilized, the programming computing device may provide the testing chamber interface 730 when the testing chamber 356 is physically simulating the grow pod and recipe program. The testing chamber interface 730 may include a testing chamber side image 732, a test cart top image 734, visual overlays 736a-736e, and a test cart side image 738. Also provided is a programming window 740.

The testing chamber side image 732 may provide a visual depiction of the test cart, as well as the chamber environment affecters to show a user operation of the testing chamber 356. Similarly, the test cart top image 734 may provide an overhead view of the test cart to show seed position, seed germination, seed growth, and/or other details about the test cart and the plants being grown in the testing chamber 356. In some embodiments the programing computing device may determine seeds and/or areas of the cart that are not receiving the desired care and/or seeds that are not growing as desired. As such, the testing chamber interface 730 may provide one or more visual overlay (736a-736e) on the test cart top image 734 to illustrate at least one different issue that were detected. The issues may be detected from a visual inspection of the seeds, from sensor data from the testing chamber 356, and/or via other mechanism. The visual overlays 736 may be provided in the testing chamber side image 732, in the test cart side image 738, and/or elsewhere.

The test cart side image 738 may again provide a view to the test cart and the seeds being grown. As discussed above, operation of the cart may be physically simulated in the testing chamber 356 and the test cart side image 738 may provide additional information regarding that simulation. As discussed above, the programming window 740 may be provided to create, load, view, simulate, and/or view the recipe program, as well as the grow pod data.

As will be understood, the testing chamber 356 may be utilized to physically simulate the grow pod and the recipe program to determine whether one instance of the recipe program operates correctly. While electronic simulation discussed above may serve one purpose, physically simulating a grow pod is a different process because the testing chamber 356 may have limited space and different equipment than a particular grow pod. As such, the programming computing device may be configured to determine the differences in the grow pod data and associated testing chamber 356 data, as well as determine adjustments to the recipe program to account for the physical differences to accurately simulate the grow pod and the recipe program. While in some embodiments, these adjustments may be automatic, some embodiments may be configured to provide the user with instructions (such as remove heating element, move humidifier, etc.) to more accurately simulate operation of the grow pod.

It should also be understood that some embodiments may be configured to first determine the adjustments for simulating the grow pod; then test those adjustments prior to actually simulating the recipe program. Once the grow pod is simulated, the recipe program may be simulated and tested.

Figure 8:
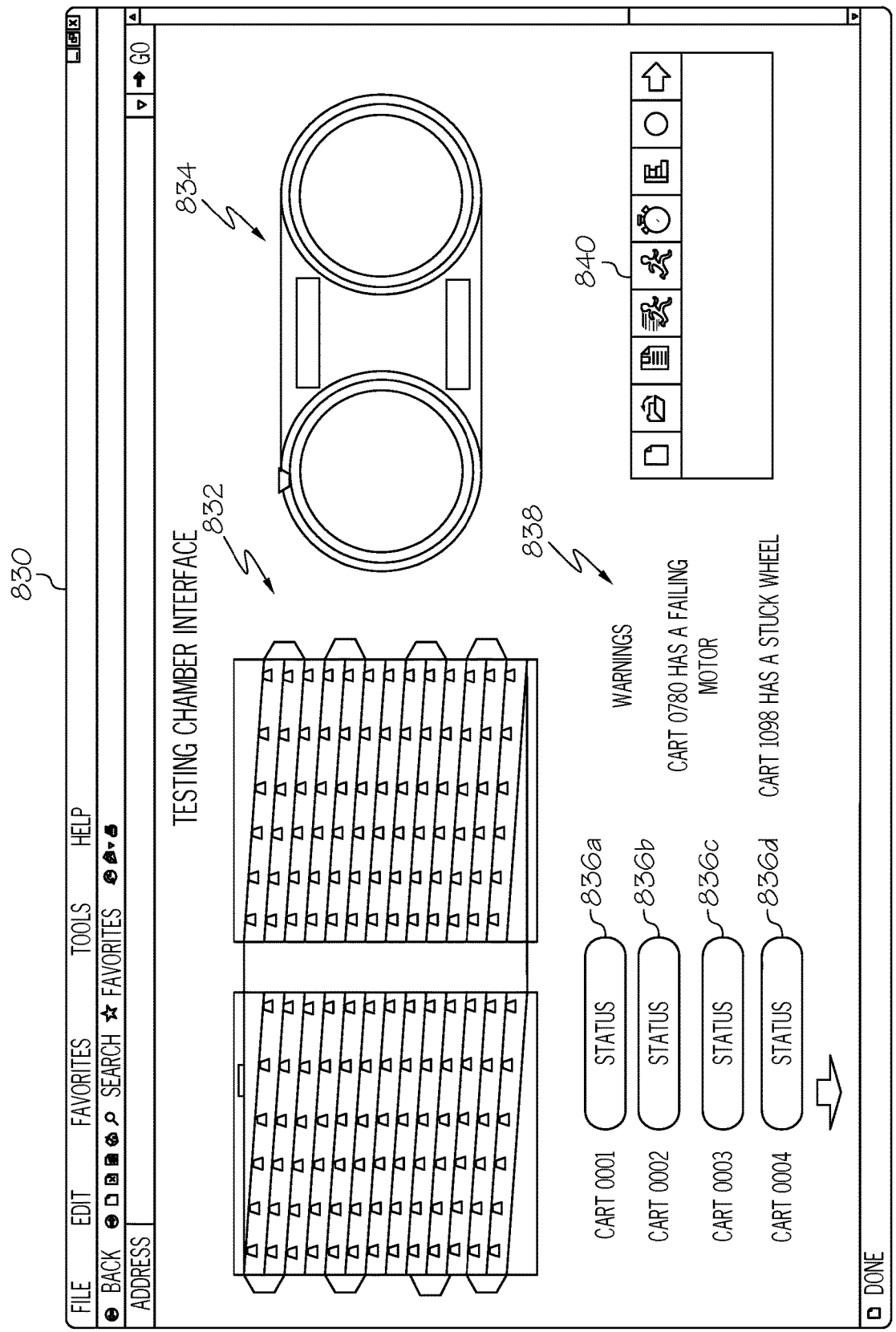
FIG. 8 depicts a testing chamber interface for providing result of a recipe program that has been physically simulated by a testing chamber, according to embodiments described herein.

FIG. 8 depicts a testing chamber interface 830 for providing result of a recipe program that has been physically simulated by a testing chamber 356, according to embodiments described herein. Similar to the simulator interface 630 from FIG. 6, the testing chamber interface 830 is configured to provide an animated depiction of the simulated cart in the simulated grow pod. As such, a simulated grow pod side image 832 may be provided, as well as a simulated grow pod top image 834, which may provide a simulated view of one or more carts that are being physically simulated in the testing chamber 356. As described above, the grow pod data may be entered by a user and/or uploaded from a file that was created by a user and/or created by the actual grow pod.

Also provided are one or more status options 836a-836d. Depending on the particular embodiment, the testing chamber 356 may test one or more carts. As such, the number of status options 836 may depend on the number of carts being utilized for a simulation. Additionally, a warnings indicator 838 may be included to illustrate warnings in the simulation. A programming window 840 may also be provided.

As discussed above with reference to FIG. 7, the testing chamber interface 830 may be configured to provide one or more overlays to indicate potential issues. Similarly, an indication of where in the grow pod the simulated carts are located may also be provided. Other indications and simulations may also be provided to further enhance data communication.

Figure 9:
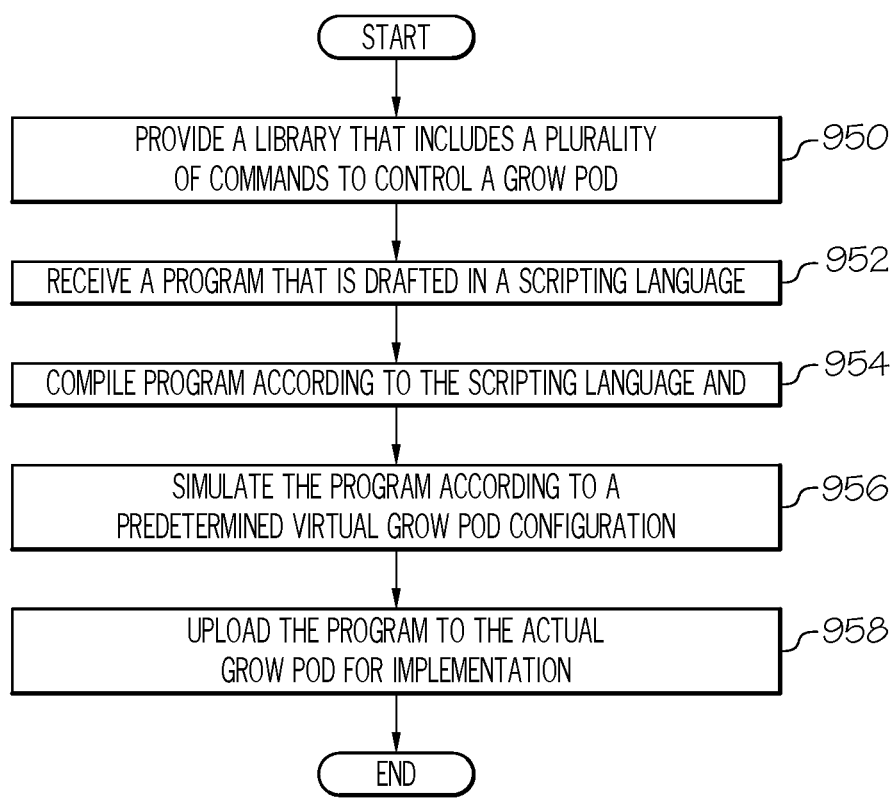
FIG. 9 depicts a flowchart for programming a grow pod, according to embodiments described herein.

FIG. 9 depicts a flowchart for programming a grow pod, according to embodiments described herein. As illustrated in block 950, a library that includes a plurality of commands in a scripting language that are specifically configured to control a grow pod is provided. In block 952, a program is received that is drafted in the scripting language and that utilizes at least one of the plurality of commands, where the program is directed to actuating at least one function of a grow pod. In block 954, the program may be compiled according to the scripting language and an option may be provided for simulating the program. An option for uploading the program to an actual grow pod may also be provided. In block 956, in response to receiving a command to simulate the program, the program may be simulated according to a predetermined virtual grow pod configuration. In block 958, in response to receiving a command to upload the program, upload the program to the actual grow pod for implementation.

Figure 10:
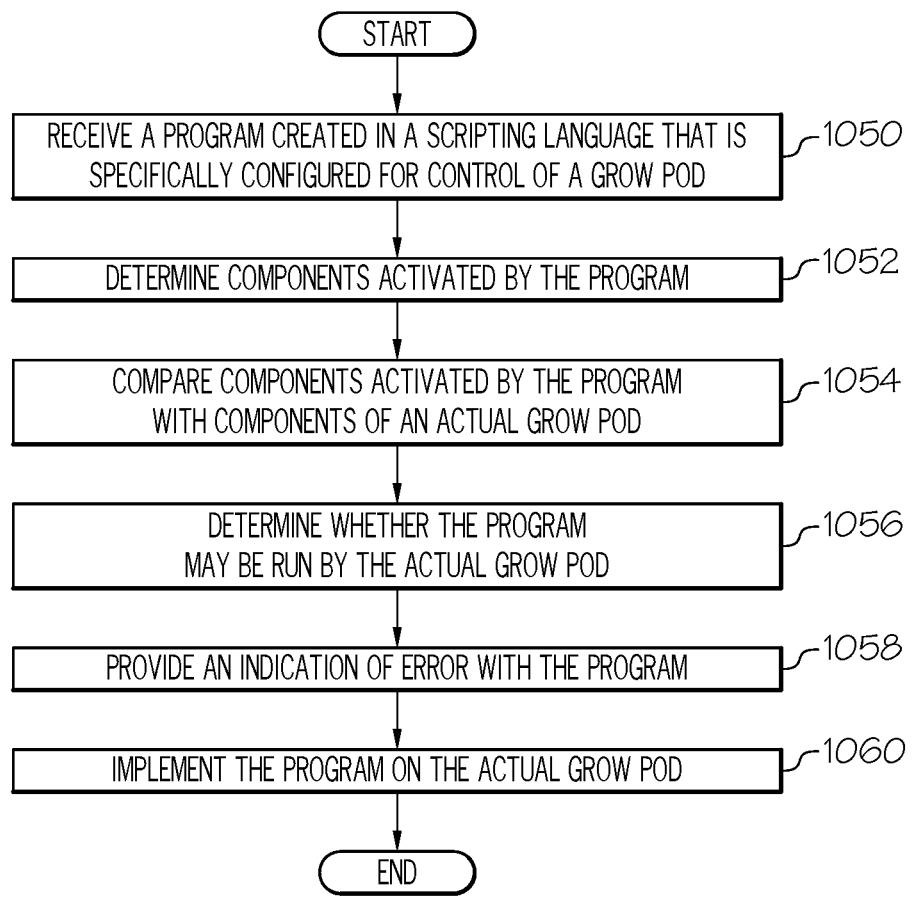
FIG. 10 depicts a flowchart for implementing a program for a grow pod, according to embodiments described herein.

FIG. 10 depicts a flowchart for implementing a program for a grow pod, according to embodiments described herein. As illustrated in block 1050, a program may be received that is created in a scripting language that is specifically configured for control of a grow pod. In block 1052, components of the grow pod that are activated by the program are determined. In block 1054, components activated by the program may be compared with components of an actual grow pod that has been requested for running the program. In block 1056, in response to a determination that the program activates a component that the actual grow pod does not have, a determination may be made regarding whether the program may still be run by the actual grow pod.

In block 1058, in response to determining that the actual grow pod cannot run the program due to the discrepancies between the program components and actual grow pod components, an indication of error with the program may be provided. In block 1060, in response to determining that the program only actuated components of the actual grow pod or that the actual grow pod may run the program even though the program includes discrepancies, the program may be implemented on the actual grow pod.

Figure 11:
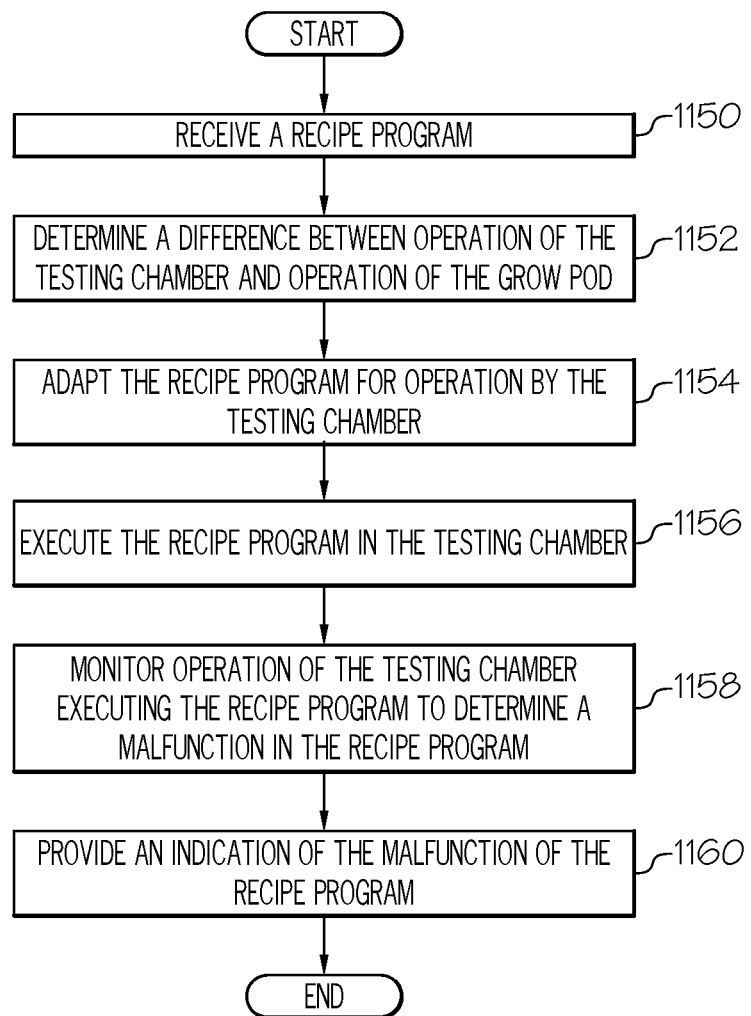
FIG. 11 depicts a flowchart for providing a testing chamber, according to embodiments described herein.

FIG. 11 depicts a flowchart for providing a testing chamber, according to embodiments described herein. As illustrated in block 1150, a recipe program may be received. The recipe program may define a grow recipe for a grow pod and may be configured to cause actuation of at least one pod environment affecter associated with the grow pod. The recipe program may have been created via a scripting language that includes a plurality of commands for controlling the grow pod. The plurality of commands in the scripting grow recipe may be specific to the particular grow pod.

In block 1152, a difference between the operation of the testing chamber and operation of the grow pod may be determined. In block 1154, the recipe program may be adapted for operation by the testing chamber. In block 1156, the recipe program may be executed for the testing chamber. In block 1158, operation of the testing chamber executing the recipe program may be monitored to determine a malfunction in the recipe program. In block 1160, an indication of the malfunction of the recipe program may be provided for output. In some embodiments, a general indication of the operation of the recipe program may be provided whether a malfunction is detected or not.

Figure 12:
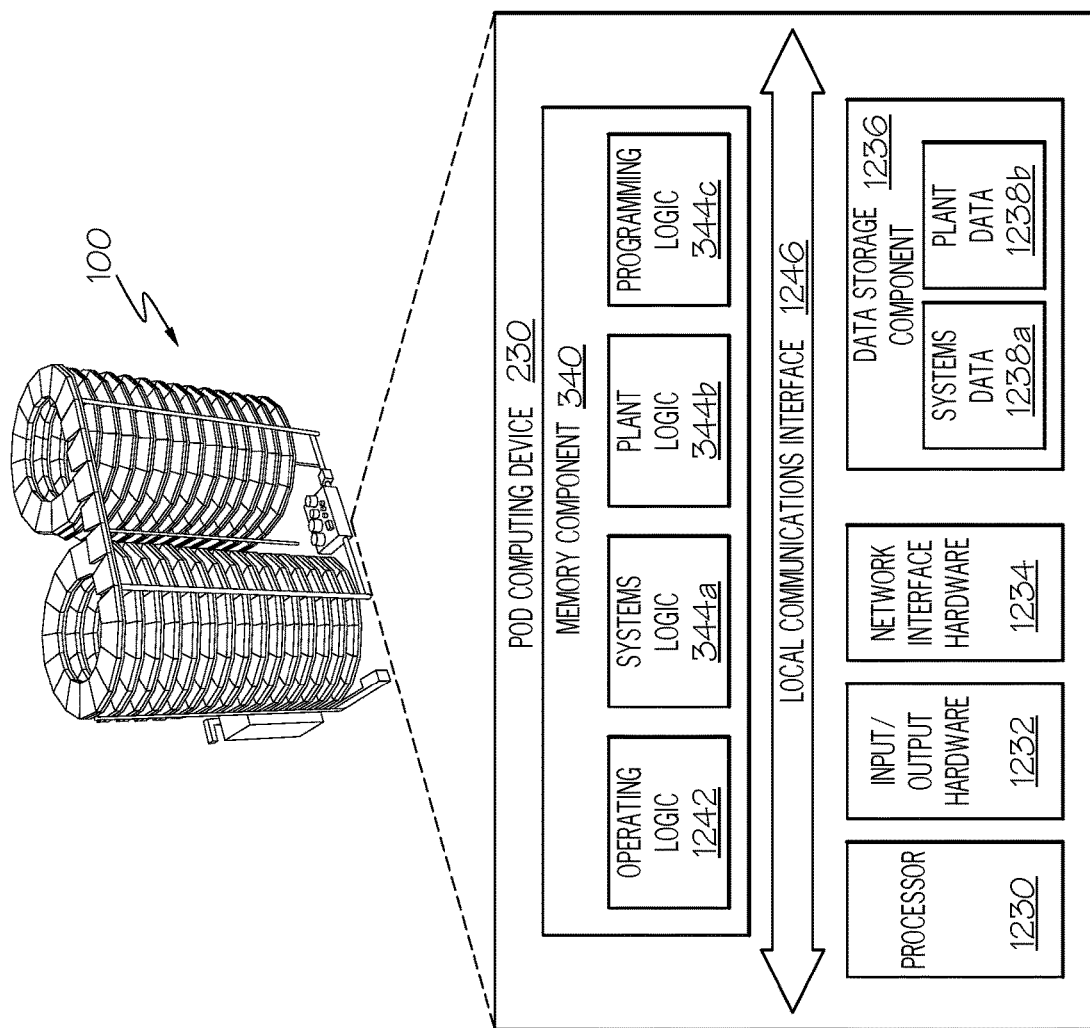
FIG. 12 depicts a computing device for an assembly line grow pod, according to embodiments described herein.

FIG. 12 depicts a pod computing device 230 for an assembly line grow pod 100, according to embodiments described herein. As illustrated, the pod computing device 230 includes a processor 1230, input/output hardware 1232, the network interface hardware 1234, a data storage component 1236 (which stores systems data 1238a, plant data 1238b, and/or other data), and the memory component 340. The memory component 340 may be configured as volatile and/or nonvolatile memory and as such, may include random access memory (including SRAM, DRAM, and/or other types of RAM), flash memory, secure digital (SD) memory, registers, compact discs (CD), digital versatile discs (DVD), and/or other types of non-transitory computer-readable mediums. Depending on the particular embodiment, these non-transitory computer-readable mediums may reside within the pod computing device 230 and/or external to the pod computing device 230.

The memory component 340 may store operating logic 1242, the systems logic 344a, the plant logic 344b, and the programming logic 344c. The systems logic 344a, the plant logic 344b, and the programming logic 344c may each include a plurality of different pieces of logic, each of which may be embodied as a computer program, firmware, and/or hardware, as an example. A local interface 1246 is also included in FIG. 12 and may be implemented as a bus or other communication interface to facilitate communication among the components of the pod computing device 230.

The processor 1230 may include any processing component operable to receive and execute instructions (such as from a data storage component 1236 and/or the memory component 340). The input/output hardware 1232 may include and/or be configured to interface with microphones, speakers, a display, and/or other hardware.

The network interface hardware 1234 may include and/or be configured for communicating with any wired or wireless networking hardware, including an antenna, a modem, LAN port, wireless fidelity (Wi-Fi) card, WiMax card, ZigBee card, Bluetooth chip, USB card, mobile communications hardware, and/or other hardware for communicating with other networks and/or devices. From this connection, communication may be facilitated between the pod computing device 230 and other computing devices, such as the user computing device 352 and/or remote computing device 354.

The operating logic 1242 may include an operating system and/or other software for managing components of the pod computing device 230. As also discussed above, systems logic 344a, the plant logic 344b, and the programming logic 344c may reside in the memory component 340 and may be configured to perform the functionality, as described herein.

It should be understood that while the components in FIG. 12 are illustrated as residing within the pod computing device 230, this is merely an example. In some embodiments, one or more of the components may reside external to the pod computing device 230. It should also be understood that, while the pod computing device 230 is illustrated as a single device, this is also merely an example. In some embodiments, the systems logic 344a, the plant logic 344b, and the programming logic 344c may reside on different computing devices. As an example, one or more of the functionalities and/or components described herein may be provided by the user computing device 352 and/or remote computing device 354.

Additionally, while the pod computing device 230 is illustrated with the systems logic 344a, the plant logic 344b, and the programming logic 344c as separate logical components, this is also an example. In some embodiments, a single piece of logic (and/or or several linked modules) may cause the pod computing device 230 to provide the described functionality.

As illustrated above, various embodiments systems and methods for programming a grow pod are disclosed. These embodiments provide for configuration of automation of the grow pod to allow for implementation of recipes and other functions of a grow pod.

Accordingly, embodiments may include systems and/or methods for programming a grow pod that includes a computing device that receives a library that includes a plurality of commands in a scripting language are specifically configured to control a grow pod is provided; receives a program that includes at least one of the commands, and provides the program for implementation by the grow pod. Embodiments provide a system related to a new type of grow pod that has benefits beyond what is found conventionally. Additionally, embodiments described herein solve problems that were not in existence prior to computer and network control of a grow pod. Other benefits are also described herein.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein include systems, methods, and non-transitory computer-readable mediums for programming a grow pod. It should also be understood that these embodiments are merely exemplary and are not intended to limit the scope of this disclosure.

What is claimed is:

1. A grow pod comprising:
    a plurality of carts for growing a plurality of respective plants;
    a plurality of pod environment affecters configured to affect each of the plurality of carts; and
    a pod computing device that includes a processor and a memory component that stores logic that, when executed by the processor, causes the grow pod to perform at least the following:
        receive a recipe program, wherein the recipe program defines a grow recipe for the grow pod, wherein the grow recipe includes actuation of at least a portion of the plurality of pod environment affecters to facilitate growth for the plurality of respective plants, wherein the recipe program was created via a scripting language that includes a plurality of commands for controlling the grow pod, wherein the plurality of commands are specific to the grow pod; and
        replicate the recipe program into a plurality of instances of the recipe program wherein each of the plurality of instances controls a respective one of the plurality of carts.

2. The grow pod of claim 1, further comprising an output device, wherein the logic further causes the output device to provide a status of each of the plurality of carts.

3. The grow pod of claim 1, wherein the recipe program is first simulated via a simulator program on a remote computing device, wherein the simulator program is configured to receive specifications of the grow pod and simulate operation of the recipe program on at least one of the plurality of carts.

4. The grow pod of claim 1, wherein the recipe program is first executed on a testing chamber, wherein:
    the testing chamber defines a closed environment that includes a test cart and a plurality of chamber environment affecters,
    the testing chamber includes a chamber computing device that receives the recipe program;
    the chamber computing device executes a test compiler for applying a single instance of the grow recipe from the recipe program to the testing chamber; and
    the recipe program actuates at least one of the plurality of chamber environment affecters.

5. The grow pod of claim 1, wherein the plurality of pod environment affecters include at least one of the following: a heater, an air conditioner, a humidifier, a dehumidifier, a fan, an oxygen generator, or a carbon dioxide generator.

6. The grow pod of claim 1, wherein the grow pod detects an issue with the recipe program and provides an alert regarding the issue.

7. The grow pod of claim 1, wherein the recipe program includes a feature to alter a portion of the grow recipe at various times to further determine improvements to the recipe program.

8. A system for programming comprising:
    a grow pod that includes a plurality of carts for growing plants and a plurality of pod environment affecters configured to affect each of the plurality of carts; and
    a programming computing device that includes a processor and a memory component that stores logic that, when executed by the processor, causes the system to perform at least the following:
        provide a scripting language that includes a plurality of commands specific to the grow pod for controlling the grow pod;
        receive data related to the grow pod;
        receive a command for the grow pod via the scripting language;
        utilize the command to create a recipe program that defines a grow recipe for the plants when utilized in the grow pod; and
        implement the recipe program on the grow pod, wherein implementing includes utilizing the grow pod to replicate the recipe program into a plurality of instances of the recipe program wherein each of the plurality of instances controls a respective one of the plurality of carts.

9. The system of claim 8, wherein the programming computing device further stores a simulator for simulating execution of the recipe program in the grow pod.

10. The system of claim 9, wherein the simulator includes a user option to simulate a subset of the plurality of carts or each of the plurality of carts.

11. The system of claim 8, further comprising a testing chamber, wherein:
    the testing chamber defines a closed environment that includes a test cart and a plurality of chamber environment affecters,
    the testing chamber includes a chamber computing device that receives the recipe program;
    the chamber computing device executes a test compiler for applying a single instance of the grow recipe from the recipe program to the testing chamber; and
    the recipe program actuates at least one of the plurality of chamber environment affecters.

12. The system of claim 8, wherein the grow pod includes a plurality of pod environment affecters, wherein the plurality of pod environment affecters includes at least one of the following: a heater, an air conditioner, a humidifier, a dehumidifier, a fan, an oxygen generator, or a carbon dioxide generator.

13. The system of claim 8, wherein the grow pod detects an issue with the recipe program and provides an alert regarding the issue.

14. The system of claim 8, wherein the recipe program includes a feature to alter a portion of the grow recipe at various times to further determine improvements to the recipe program.

15. A programming computing device for programming a grow pod, the grow pod including a plurality of carts for growing a plurality of respective plants and a plurality of pod environment affecters configured to affect each of the plurality of carts, the programming computing device comprising:

a processor; and a memory component that stores programming logic that, when executed by the processor, causes the programming computing device to perform at least the following:

provide a scripting language that includes a plurality of commands for controlling the grow pod;

receive data related to the grow pod;

receive a command for the grow pod via the scripting language;

utilize the command to create a recipe program that defines a grow recipe for plants utilized in the grow pod; and send the recipe program to the grow pod for implementation, wherein implementation includes utilizing the grow pod to replicate the recipe program into a plurality of instances wherein each of the plurality of the instances controls a respective one of the plurality of carts.

16. The programming computing device of claim 15, wherein the programming computing device is configured as a remote computing device relative to the grow pod.

17. The programming computing device of claim 16, wherein the programming computing device is configured as a pod computing device that is integrated into the grow pod.

18. The programming computing device of claim 15, wherein the programming computing device further stores a simulator for simulating execution of the recipe program in the grow pod and wherein the simulator includes a user option to simulate a subset of the plurality of carts or each of the plurality of carts.

19. The programming computing device of claim 15, wherein the recipe program is implemented on a testing chamber, the testing chamber defines a closed environment that includes a test cart and a plurality of chamber environment affecters, the testing chamber includes a chamber computing device that receives the recipe program;

the chamber computing device executes a test compiler for applying a single instance of the grow recipe from the recipe program to the testing chamber; and the recipe program actuates at least one of the plurality of chamber environment affecters.

20. The programming computing device of claim 15, wherein the recipe program includes a feature to alter a portion of the grow recipe at various times to further determine improvements to the recipe program.

* * * * *